(12) United States Patent
Ferrus

(10) Patent No.: US 8,735,964 B2
(45) Date of Patent: May 27, 2014

(54) CHARGE CARRIER DEVICE

(75) Inventor: Thierry Ferrus, Cambridge (GB)

(73) Assignee: Hitachi, Ltd., Tokyo, PA (US)

( * ) Notice: Subject to any disclaimer, the term of this patent is extended or adjusted under 35 U.S.C. 154(b) by 738 days.

(21) Appl. No.: 12/902,483

(22) Filed: Oct. 12, 2010

(65) Prior Publication Data
US 2011/0085381 A1 Apr. 14, 2011

(30) Foreign Application Priority Data

Oct. 12, 2009 (EP) .................................. 09172811

(51) Int. Cl.
*H01L 29/792* (2006.01)
*G11C 11/34* (2006.01)

(52) U.S. Cl.
USPC ........... 257/324; 257/314; 257/315; 257/316; 257/E29.309; 365/185.01; 365/178

(58) Field of Classification Search
USPC ............. 365/174, 178, 185.18; 257/314–316, 257/324, 325, E29.309
See application file for complete search history.

(56) References Cited

U.S. PATENT DOCUMENTS

| | | | |
|---|---|---|---|
| 5,905,273 A | 5/1999 | Hase et al. | |
| 6,140,181 A | 10/2000 | Forbes et al. | |
| 6,159,829 A * | 12/2000 | Warren et al. | 438/530 |
| 6,593,195 B1 * | 7/2003 | Deng et al. | 438/288 |
| 7,038,234 B2 | 5/2006 | Ghamaty et al. | |
| 2006/0121661 A1 | 6/2006 | Yang et al. | |
| 2007/0108502 A1 | 5/2007 | Li et al. | |

FOREIGN PATENT DOCUMENTS

EP 1 262 911 A1 12/2002

OTHER PUBLICATIONS

Takahashi et al., Si memory device operated with a small number of electrons by using a single-electron-transistor detector, Electronics Letters, vol. 34, No. 1, Jan. 8, 1998, p. 45-46.*
H. Sunamura et al., Single-electron memory using carrier traps in a silicon nitride layer, Applied Physics Letters, Jun. 7, 1999, pp. 3555-3557, vol. 74, No. 23.
Haroon Ahmed et al., Single-electron devices, Microelectronic Engineering 32, 1996, pp. 297-315.
T Ferrus et al., Activation mechanisms in sodium-doped silicon MOSFETs, Journal of Physics: Condensed Matter 19 (2007) 226216, pp. 1-10.
Robert Raussendorf et al., Measurement-based quantum computation on cluster states, Physical Review a 68, 022312 (2003).
A. Kogan et al., Singlet-triplet transition in a single-electron transistor at zero magnetic filed, Physical B 67, 113309 (2003).

(Continued)

*Primary Examiner* — Allison P Bernstein
(74) *Attorney, Agent, or Firm* — Antonelli, Terry, Stout & Kraus, LLP.

(57) ABSTRACT

An apparatus is provided which includes an array of impurity ions disposed in an insulating region, a semiconductor region adjacent to the insulating region, an array of electrometers arranged to detect charge carriers in the semiconductor region and an array of sets of at least one control gate configured to apply an electric field to the insulating region and semiconductor region. Each control gate is operable to cause at least one charge carrier in the semiconducting material region to bind to the impurity ion without the at least one charge carrier leaving the semiconductor material region. The electrometers are operable to detect whether the at least one charge carrier is bound to the impurity ion.

19 Claims, 22 Drawing Sheets

(56) References Cited

OTHER PUBLICATIONS

Dong-Hyuk Chae et al., Nanocrystal Memory Cell Using High-Density $SI_{0.73}Ge_{0.27}$ Quantum Dot Array, Journal of the Korean Physical Society Dec. 1999, pp. S995-S998, vol. 35.

H.D. Wanzenboeck et al., Dot-array implantation for patterned doping of semiconductors, Nuclear Instruments an Method in :Physics Research B 242, 2006, pp. 257-260.

Atsushi Kohno et al., Memory Operation of Silicon Quantum-Dot Floating-Gate Metal-Oxide-Semiconductor Field-Effect Transistors, Japanese Journal Applied Physic, 2001, pp. L721-L723, vol. 40.

Rama Venkatasubramanian et al., Thin-film thermoelectric devices with high room-temperature figures of merit, Nature, Oct. 11, 2001, pp. 597-602, vol. 413.

M. V. Rastei et al., Electrochemical growth of Co nanodots on patterned Si substrates, Applied Physics Letters, Sep. 13, 2004, vol. 85, No. 11.

* cited by examiner

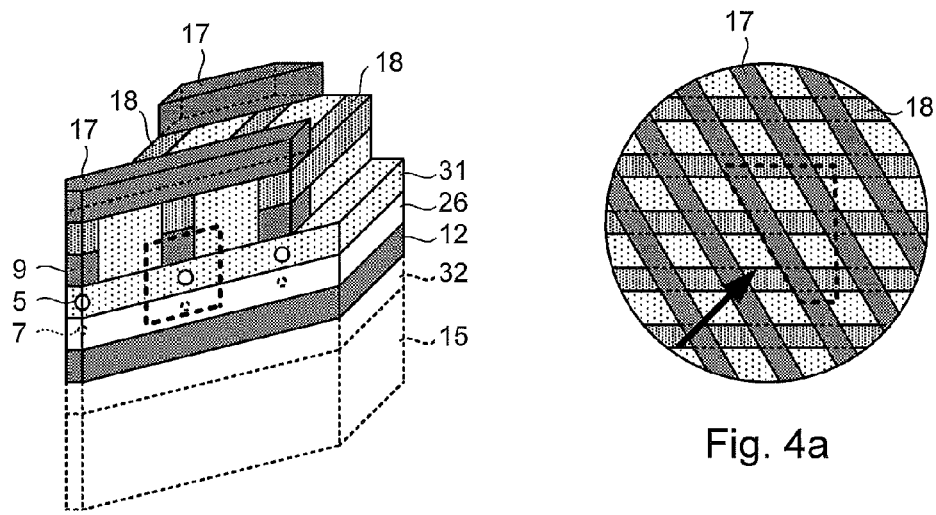
Fig. 4
Fig. 4a
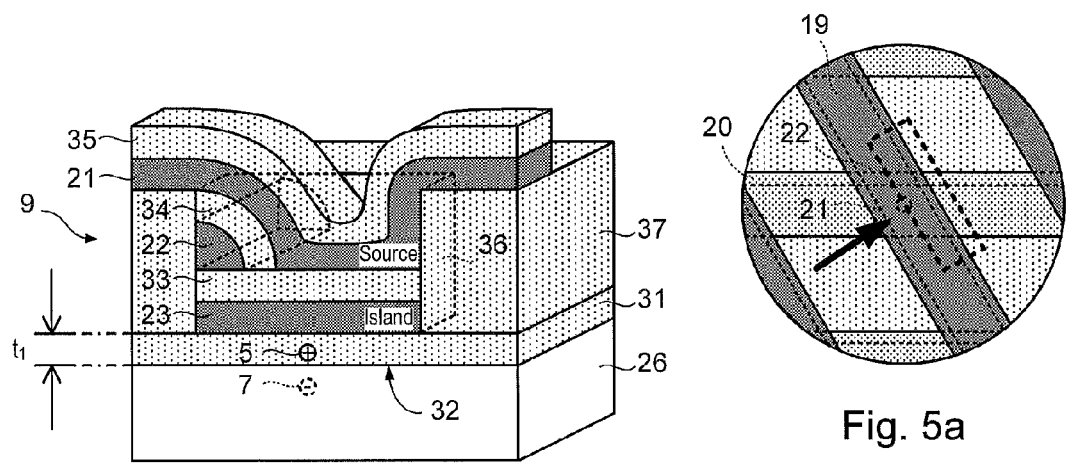
Fig. 5
Fig. 5a (j)

(k)

(e)

(f)

(g)

(h)

(n)

(o)

(p)

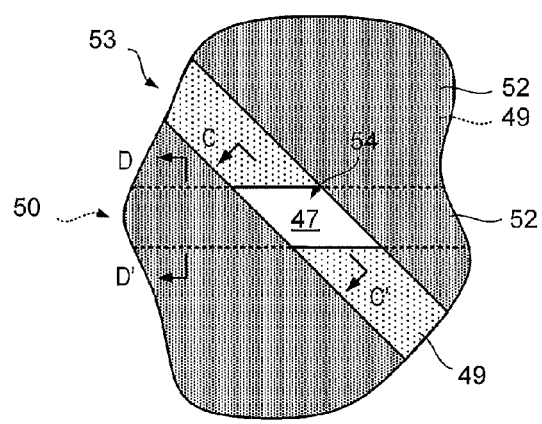
Fig. 12
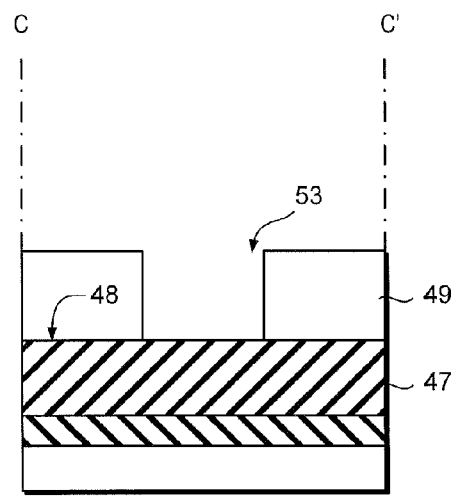 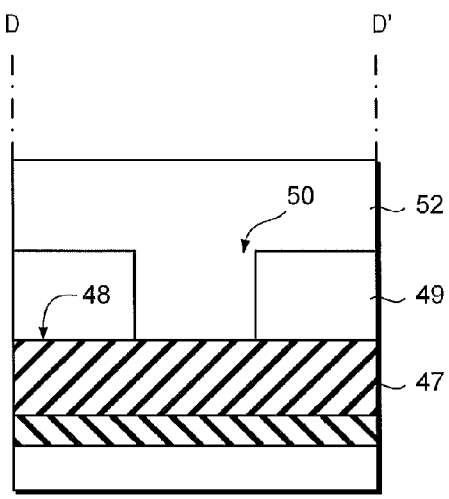
Fig. 13a    Fig. 13b (a)

(b)

CHARGE CARRIER DEVICE

FIELD OF THE INVENTION

The present invention relates to a charge carrier device for particular, but not exclusive use as a memory device and/or a quantum information processing device.

BACKGROUND

Memory devices based on arrays of quantum dots are known. For example, "Nanocrystal Memory Cell Using High-Density $Si_{0.73}Ge_{0.27}$ Quantum Dot Array" by D-H. Chae et al., Journal of the Korean Physical Society, volume 35, pages S995 to S998 (1999) describes a metal-oxide-semiconductor field-effect transistor (MOSFET) in which silicon-germanium nanocrystals are incorporated into the gate oxide. "Memory Operation of Silicon Quantum-Dot Floating-Gate Metal-Oxide-Semiconductor Field-Effect Transistor" by A. Kohno et al., Japanese Journal of Applied Physics, volume 40, pages L721 to 723 (2001) describes a similar device in which silicon quantum dots are used. Another similar device is also described in US 2007/108502 A1.

In these types of devices, quantum dots are charged and discharged by electrons tunnelling to and from a channel through a thin gate oxide. Thus, write, erase and hold times depend on the thickness of the gate oxide. Therefore, although the gate oxide can be made thicker to increase the hold time, this also increases the write and erase times. Moreover, a thicker gate oxide tends to require larger write and erase voltages.

Another significant drawback of these types of device is that the gate oxide tends to degrade with use.

Similar, but more complex, memory devices have also been proposed. For example, U.S. Pat. No. 5,905,273 A describes a field-effect transistor having three-dimensional array of quantum dots comprising indium arsenide (InAs) embedded in a layer of aluminium gallium arsenide (AlGaAs) lying between a gallium arsenide (GaAs) channel and a gate electrode. In this device, electrons can tunnel between quantum dots.

In this type of device too, operation involves tunnelling between quantum dots and, thus, regions of AlGaAs between quantum dots are also liable to degrade with use. Generally, these memory devices tend to require high voltages to operate. For example, source and drain voltages of a few volts and gate voltages of the order of magnitude of 10 V are common.

Moreover, if a memory device is found not to operate properly due to, for example, misalignment or stray impurities, then there is little, if any, scope for repairing the device.

Although these types of devices can be fabricated using quantum dots which arrange themselves into an array, control over the position of quantum dots is limited.

One solution is to use high-resolution fabrication processes, such as a electron-beam lithography, focused ion-beam milling or focussed ion-beam implantation, to define the position (or intended position) of dots.

For instance, "Electrochemical growth of Co nanodots on patterned Si substrates" by M. V. Rastei et al., Applied Physics Letters, volume 85, pages 2050 to 2052 (2004) describes prestructuring a silicon substrate and using the prestructured substrate as a nano-electrode template to perform a selective electrodeposition of cobalt nanodots. "Dot-array implantation for patterned doping of semiconductors" by H. D. Wanzenboeck et al., Nuclear Instruments and Methods in Physics Research Section B: Beam Interactions with Materials and Atoms, volume 242, page 257 (2006) describes doping silicon with a focused ion beam.

However, these techniques tend not to be particularly suited to forming arrays on a large scale. For example, the maximum storage density is limited to about $10^{10}$ bits/cm$^2$. Moreover, dots formed using focused ion-beam implantation tend to contain about $10^5$ ions per dot. It is desirable to reduce the number of ions per dot.

SUMMARY

The present invention seeks to ameliorate one or more of these problems.

According to a first aspect of the present invention there is provided a device comprising an impurity ion disposed in an insulating region, a semiconductor region adjacent to the insulating region, an electrometer arranged to detect charge carriers in the semiconductor region and at least one control gate configured to apply an electric field to the insulating region and semiconductor region, wherein the at least one control gate is operable to cause at least one charge carrier in the semiconducting material region to bind to the impurity ion without the at least one charge carrier leaving the semiconductor material region and wherein the electrometer is operable to detect whether the at least one charge carrier is bound to the impurity ion.

Thus, the device can avoid the need for a charge carrier to tunnel through the insulating region, for example, to be stored. Since the charge carrier is trapped in the semiconductor region and not the insulating region, the device is less prone to degradation through use. An array of device can be formed based on a hexagonal array of ions having an array lattice constant of a few 10 s of nanometers or less, e.g. about 40 nm. Therefore, a storage density can be achieved which is of the order of magnitude of $10^{10}$ or $10^{11}$ bits/cm$^2$ (or 0.1 or 1 Tbit/in$^2$). Since tunnelling is not required, lower gate voltages can be used needed to write and erase data. Furthermore, an ion can be used not only to trap only one electron, but two electrons and so allow storage of trinary digits ("trits"). This can help to increase further storage density.

The impurity ion can be a positively charged ion and the at least one charge carrier can be at least one electron. The impurity ion can be a single-valence electron ion. The impurity ion may comprise hydrogen, sodium, lithium or potassium.

The semiconductor region may comprise silicon. The insulating region may comprise a dielectric material, such as silicon dioxide. The insulating region may comprise a depletion region in a semiconductor.

The device may comprise a spacer region separating the insulating region and the semiconductor region.

The insulating region and the semiconductor region may comprise a layer of dielectric material adjoining, e.g. overlying, a layer of semiconductor material.

The electrometer may comprise a source region, a drain region and a floating island configured such that a conduction path is formed between the source and drain regions via the floating island. The floating island may be adjacent to the insulating region. For example, the floating island may adjoin the insulating region.

The use of an electrometer, particularly a single-electron electrometer, can help reduce the voltage(s) needed to read data. For example, it may be possible to read data using on a few millivolts. Moreover, the use a single-electron electrometer can help to minimise disturbance of the charge.

The device may comprise a cooler thermally coupled to at least the insulating region and configured to cool the insulating region below a transition temperature so as to cause the impurity ion to be frozen in position in the insulating region.

The use of a mobile ion in conjunction with a cooler can help to align the ion with the electrometer. Also, it can provide the facility of repairing a device by repositioning the ion.

The at least one control gate may include a first gate provided by a portion of a first conductive line and a second gate provided by a portion of a second conductive line which crosses the first conductive line.

The device may be a memory device.

The device may be a quantum information processing device.

According to a second aspect of the present invention there is provided apparatus comprising an array of devices according to any preceding claim and circuitry for controlling the array of devices.

As mentioned earlier, an array of device can be formed based on a hexagonal array of ions having a lattice constant of a few 10 s of nanometers and so a storage density of about $10^{11}$ or more is achievable.

According to a third aspect of the present invention there is provided method of operating a device comprising an impurity ion disposed in an insulating region, a semiconductor region adjacent to the insulating region, an electrometer arranged to detect charge carriers in the semiconductor region and at least one control gate configured to apply an electric field to the insulating region and semiconductor region, the method comprising applying bias(es) to the at least one control gate to cause at least one charge carrier in the semiconductor region to bind to the impurity ion without the at least one charge carrier leaving the semiconductor material region and using the electrometer to detect whether the at least one charge carrier is bound to the impurity ion.

The method may further comprise at a first temperature at which the ion is mobile, applying bias(es) to the at least one control gate so as to position the ion in the insulating region, removing the bias(es), cooling the insulating region to a second temperature above a transition temperature at which the impurity ion is frozen in position, waiting for at least a predetermined period of time at the second temperature, cooling the insulating region to a third temperature below the transition temperature.

According to a fourth aspect of the present invention there is provided a method of fabricating a device, comprising providing a semiconductor region, providing an insulating region adjacent to the semiconductor region, providing an impurity ion in the insulating region, providing an electrometer arranged to detect charge carriers in the semiconductor region and providing at least one control gate configured to apply an electric field to the insulating region and semiconductor region.

BRIEF DESCRIPTION OF THE DRAWINGS

Certain embodiments of the present invention will now be described, by way of example, with reference to the accompanying drawings, in which:

FIG. 4 is a schematic perspective view of a device;

FIG. 4a is a magnified plan view of an array of devices including an outline of the part of the array which is illustrated in FIG. 4;

FIG. 5 is schematic magnified view of the device;

FIG. 5a is a magnified plan view of an array of devices including an outline of the part of the array which is illustrated in FIG. 4;

FIG. 12 is a plan view of a first and second resist patterns formed by first and second masks;

FIG. 13a is a cross sectional view of the resists shown in FIG. 12 taken along line C-C';

FIG. 13b is a cross sectional view of the resists shown in FIG. 12 taken along line D-D';

DETAILED DESCRIPTION OF CERTAIN EMBODIMENTS

Figure 1:
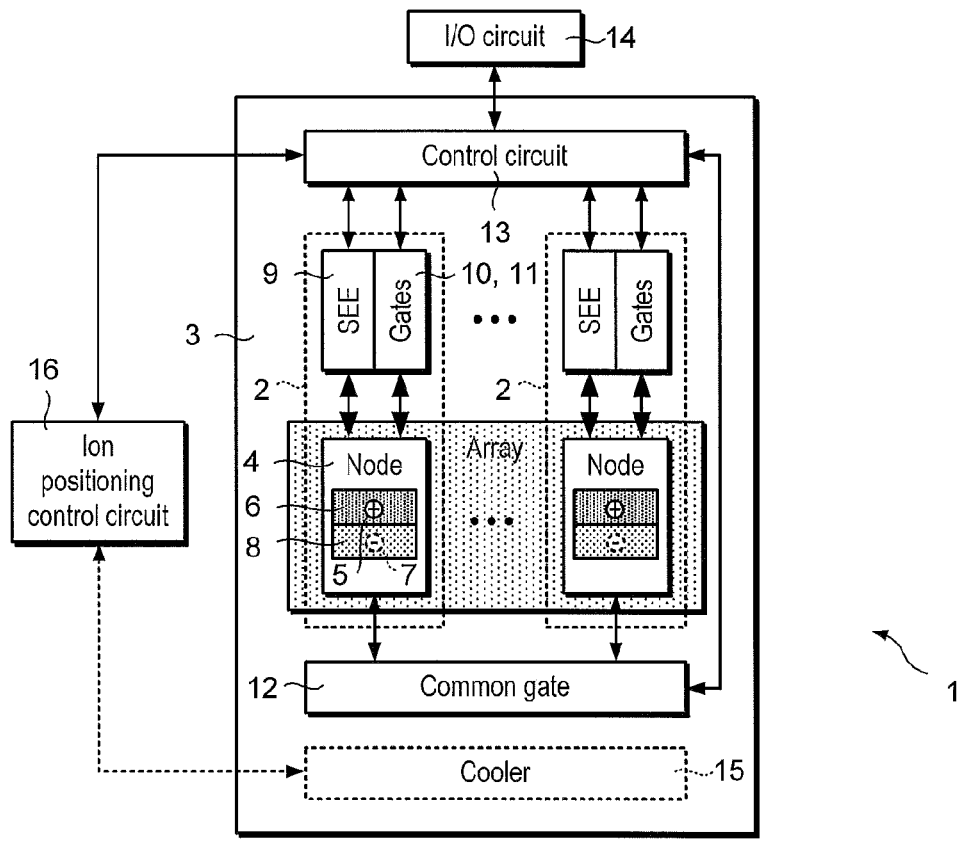
FIG. 1 is a schematic block diagram of an array of devices.
Figure 2:
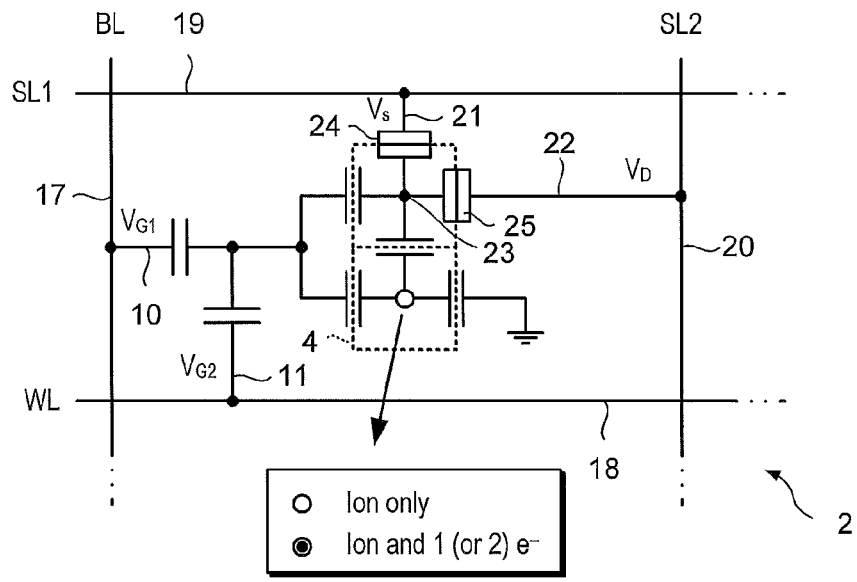
FIG. 2 illustrates use of a charge carrier device as a memory cell.

Referring to FIGS. 1 and 2, a schematic block diagram of apparatus 1 is shown which includes an array of ion-controlled charge carrier devices 2 formed on a processed chip 3.

The memory apparatus 1 includes an array of data-storing regions 4 (herein referred to as "nodes"). Each node 4 comprises a respective ion 5 which lies in an insulating region 6. One or more mobile charge carriers 7, such as electrons, located in a adjacent (for example, adjoining) semiconductor region 8 can reversibly bind to each ion 5. The charge carriers 7 do not need to tunnel into the insulating region 6 to bind to the ion 5. Instead, the charge carrier 7 remains spaced apart from the ion 5, e.g. by between about 3 and 30 nm. As will be explained in more detail, the regions 6, 8 are formed by a layer of dielectric material in contact with a layer of semiconducting material. However, in some examples, the regions 6, 8 need not be adjoining. For example, a layer of one type of dielectric material may be separated from a layer of semiconducting material by a layer of another type of dielectric material which may function as a spacer layer and/or a diffusion barrier. Additionally or alternatively, more than one layer of semiconductor material may be used.

The nodes 4 are read and programmed using an array of electrometers 9 and sets of gates 10, 11. Each node 4 is provided with a respective electrometer 9 so as to read out data from the node 4. Each node 4 is also provided with a set of gates 10, 11 so as to program the node 4. A common gate 12 can be provided to help configure the devices 2.

The devices 2 can be individually addressed by an on-chip control circuit 13. The control circuit 13 can be used to program the devices 2 with data received from an input/output circuit 14.

As will be explained in more detail later, ions 5 may be individually positioned in each device 2. Ions 5 which are mobile in the insulating region 6 (at a temperature above the operating temperature of the devices 2) can be manipulated using gates 10, 11, 12. Moreover, for an appropriate concentration, mobile ions 5 can arrange themselves into a regular array (similar to an electron Wigner crystal) through Coulomb repulsion.

To freeze the ions 5 in position ready for device operation, a refrigerator (not shown) can be used to reduce the temperature of the devices 2 below a glass transition temperature, $T_g$, of the ions 5 in the insulating region. Additionally or alternatively, an on-chip, multiple-stage thermoelectric cooler 15 can be used. As will be explained in more detail later, the devices 2 can be taken from a first temperature, $T_1$, which is usually at room temperature, and cooled to an operating temperature $T_3$.

The gates 10, 11, 12 and the cooler 15 are controlled by an ion-positioning control circuit 16.

Each node 4 can be used to store a binary digit ("bit") of data. For example, if no charge carrier 7 is bound to an ion 5, then this can represent a state '0'. If one charge carrier 7 is bound to an ion 5, then this can represent a state '1'.

However, the devices 2 can be operated such that each node 4 can store a trinary digit (or "trit") of data. Thus, in addition to storing '0' and '1' states as described earlier, the node 4 can be used to store a '2' state, when two charge carriers 7 are bound to an ion 5.

Referring also to FIG. 2, each node 4 is addressable through bit and word lines 17, 18 (also referred to as "BL" and WL" respectively) and through a pair of sense lines 19, 20 (also referred to as "SL1" and "SL2"). The bit and word lines 17, 18 can be used to program the node 4 by applying appropriate biases, $V_{G1}$ and $V_{G2}$, to gates 10, 11. The sense lines 19, 20 can be used to read the node 4 by applying appropriate biases, $V_S$ and $V_D$, to source and drain region 21, 22 of the electrometer 9 and measuring current $I_{SD}$ through the electrometer 9. The electrometer 9 includes a floating region 23 (herein also referred to as a "conductive island") isolated from the source and drain 21, 22 by respective tunnel barriers 24, 25.

The electrometer 9 is a single-electron electrometer. Thus, the island 23, tunnel barriers 24, 25 and surrounding regions of the device 2 are arranged so that the electrometer 9 exhibits Coulomb blockade.

As shown in FIG. 2, the island 23 is capacitively coupled to the node 4 and is able to detect whether the ion 5 is unpaired or is bound to one (or more) charge carriers 7.

Figure 3:
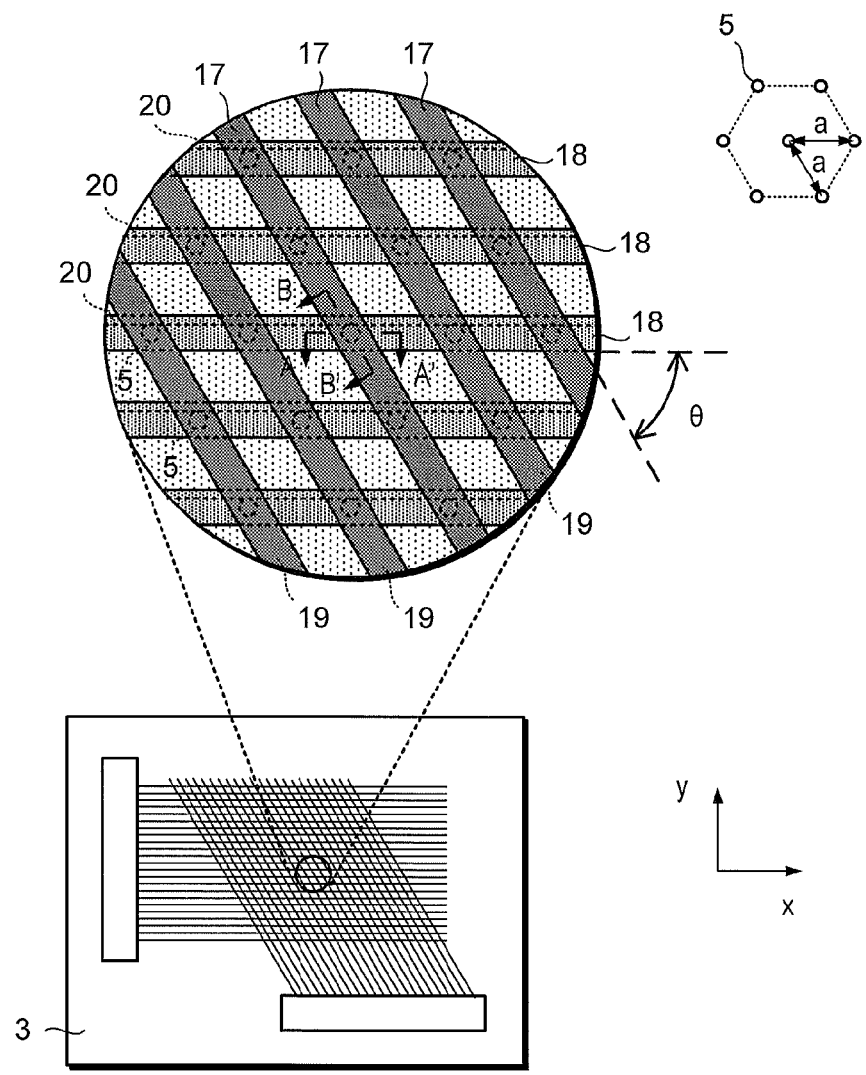
FIG. 3 is a schematic plan view of a chip which includes an array of devices.

Referring also to FIG. 3, a schematic plan view of the chip processed 3 is shown.

As shown in FIG. 3, the bit lines 17 and word lines 18, and the first sense line 19 and the second sense line 2, intersect at an angle, θ, which is about 60°. The ions 5 are located at the intersection of the lines 17, 18. Thus, the ions 5 are arranged in a regular hexagonal array. As will be explained later, the ions 5 tend to form a hexagonal array naturally due to repulsive electron-electron interaction. In this example, the array has a lattice constant, a, of about 40 nm.

Figure 3A:
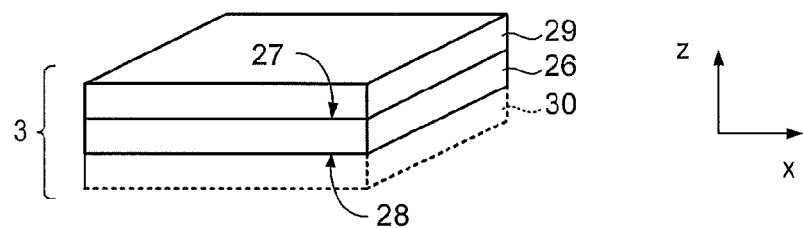
FIG. 3a is a schematic perspective view of the chip shown in FIG. 3.

Referring also to FIG. 3a, the processed chip 3 comprises a substrate 26 having first and second faces (or "sides") 27, 28 on which layers are deposited and patterned. On a first side 27 (herein referred to as the "front side") of the substrate 26, a first arrangement of patterned layers form, among other things, the devices 2. On a second side 28 of the substrate 23 (the "reverse side"), a second arrangement of patterned layers 30 can form, among other things, the cooler 15.

Referring to FIGS. 4 and 5, partial perspective views of the processed chip 3 are shown.

Referring in particular to FIG. 4, the substrate 26 comprises a high-resistivity (e.g. $\rho \geq 10{,}000\ \Omega \cdot cm$) un-doped silicon (Si) substrate. As will be explained in more detail later, an upper portion of the substrate 26 provides the semiconductor region 8 (FIG. 1).

On the front side 27 of the substrate 26, a layer 31 of dielectric material having a thickness, $t_1$, overlies the substrate 26. In this example, the layer 31 comprises silicon dioxide ($SiO_2$) and has a thickness, $t_1$, of about 40 nm. Preferably, a non-amorphous (for example, crystalline) form of $SiO_2$ is used so as to minimise defects. In this example, the dielectric layer 31 provides the insulating region 6 (FIG. 1).

On the reverse side 28 of the substrate 26, the common gate electrode 12 is formed.

As explained earlier, a cooler 15 can be provided. This can be formed on the reverse side 28 of the substrate 26, separated from the gate 12 by a layer 32 of dielectric material.

As shown in FIGS. 4 and 5, ions 5 are embedded in the layer 31 of dielectric material. In this example, the ions 5 are (non-magnetic) sodium ions ($Na^+$). However, any type of fast diffuser ion, such as sodium ($Na^+$), lithium ($Li^+$), potassium ($K^+$) and hydrogen ($H^+$), can be used.

These types of ions generally have a high value of diffusion coefficient in the dielectric material at room temperature (about 293 K) and a low value of diffusion coefficient in the dielectric material at the device operating temperature. Thus, the ions 5 are mobile and can be manipulated at room temperature. The ions 5 are frozen in position by reducing the temperature of the substrate, for example, to about 77 K or below.

These types of ions are hydrogen-like having a single valence electron and can bind with a single electron to form a charge-neutral D0 state. However, under suitable conditions, an ion can bind with two electrons to form a negatively-charged D_ state.

In some embodiments, the ions 5 may be ferromagnetic, such as manganese ($Mn^{2+}$). An electrometer 9 having ferromagnetic region(s) can be used not only to detect charge, but also spin orientation.

The ion 5 and the charge carrier 7 can be separated, but still be bound, by distances between about 3 and 30 nm. The distance depends on ion species, ion density, dielectric material, semiconducting material, disorder and temperature. In this example, for sodium ions having concentration about $2 \times 10^{12}\ cm^{-2}$, embedded in silicon dioxide which is in contact with high-resistivity silicon and cooled below 120 K, the ion 5 and an electron 7 can still be bound if separated by about 25 to 30 nm.

Other combinations of dielectric materials and ion can be used. In some embodiments, a dielectric material and ion species may be used which result in ions being immobile at higher temperatures, e.g. above 77 K and even at room temperature. This can allow a higher operating temperature. Thus, in certain embodiments, it may be necessary to heat the substrate so as to cause the ions to become mobile so as to allow them to be positioned.

As shown in FIGS. 4 and 5, the dielectric material layer 31 is shared by more than memory device 2.

For an undoped substrate 26 and a positively-charged ion 5 (i.e. a cation), the mobile charge carrier 7 takes the form of an electron. However, the ion may be negatively charged and so the charge carrier 7 can take the form of positively-charged particle, such as a hole.

As explained earlier, a high resistivity substrate is used. This can help reduce scattering at the interface 32 between the semiconductor and the dielectric.

Figure 6:
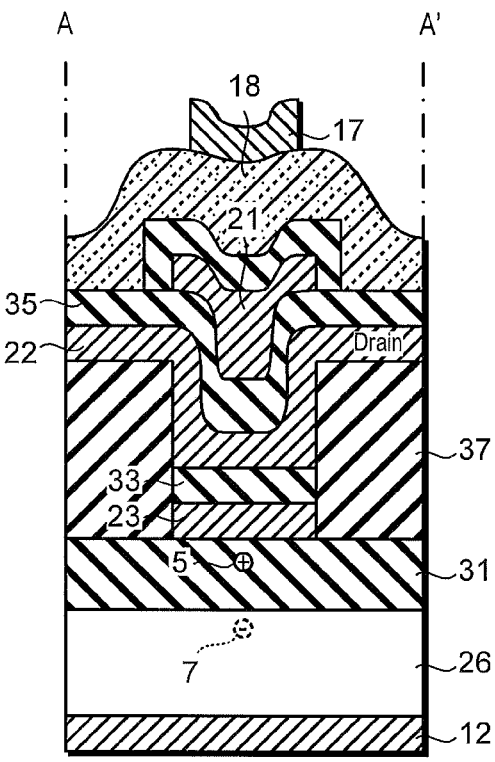
FIG. 6 is a sectional view of the device shown in FIG. 3 taken along the line A-A'.
Figure 7:
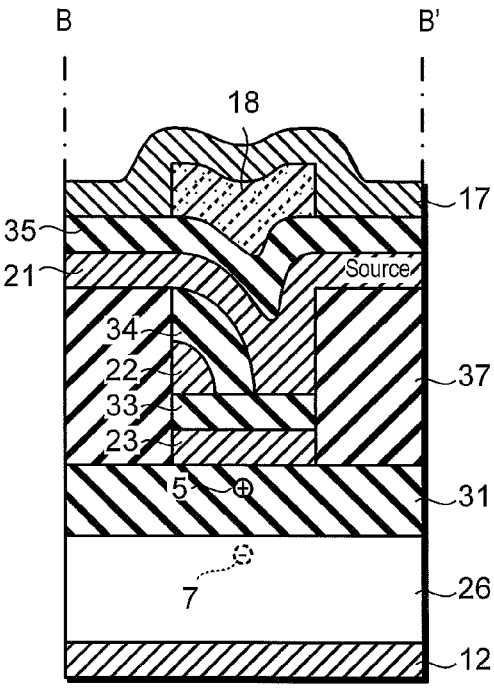
FIG. 7 is a sectional view of the device shown in FIG. 3 taken along the line B-B'.

Referring still to FIGS. 4 and 5 and also referred to FIGS. 6 and 7, in the vicinity of the rest of the device, the bit line 17 and word line 18 provide first and second gates 10, 11 respectively. The bit line 17 takes the form of a conductive track comprising a metal or metal alloy, although it can comprise a semiconductor material. The word line 18 takes the form of a conductive track comprising a doped semiconductor material. The word line 18 may be doped between about $1 \times 10^{15}$ and $1 \times 10^{18}$ cm$^{-3}$ and an appropriate doping concentration can be found by routine experiment. In this example, the bit line 17 comprises aluminium (Al) and the word line 18 comprises polycrystalline silicon.

Referring in particular to FIG. 4, the electrometer 9 is disposed between the dielectric layer 31 and word line 18.

Referring in particular to FIG. 5, in the vicinity of the rest of the device, the first and second sense lines 19, 20 provide the source 21 and drain 22 of the electrometer 9 (FIG. 4). The sense lines 19, 20 take the form of conductive tracks comprising a metal or metal alloy. In this example, the sense lines 19, 20 comprise aluminium (Al).

The conductive island 23 of the electrometer 9 takes the form of a thin plate of conductive material, which in this example, comprises aluminium (Al). A first layer 33 of dielectric material, in this case aluminium oxide (Al$_2$O$_3$), separates and isolates the island 23 from the source 21 and drain 22. Thus, the first dielectric layer 33 serves to provide both of the tunnel barriers 24, 25 (FIG. 2). The source 21 and drain 22 are isolated by a second layer 34 of dielectric material which also comprises aluminium oxide (Al$_2$O$_3$). The first sense line 19/source 21 is covered by a third layer 35 of dielectric material which also comprises aluminium oxide (Al$_2$O$_3$). The second and third dielectric layers 34, 35 are thicker than the first dielectric layer 33 so as to reduce leakage.

The electrometer 9 is formed in a hole 36 (or "via") in a patterned layer 37 of dielectric material, which in this example, comprise silicon nitride (Si$_3$N$_4$).

Referring again to FIG. 1, as explained earlier, the devices 2 can be cooled using a refrigerator (not shown). For example, liquid nitrogen can be used to cool the devices to 77 K. Liquid helium can be used to cool the devices to 4.2 K. The devices 2 can also be cooled using a cold finger or plate which is cooled, for example, by circulating helium gas. However, the devices 2 can be cooled, at least in part, by a multi-stage thermoelectric cooler 15. For example, the devices 2 can be cooled using a mesoscopic cascade thermoelectric cooler based on Bi$_x$Sb$_{2-x}$Te$_3$ and Bi$_2$Te$_{3-x}$Se$_x$ superlattice, such as that described in U.S. Pat. No. 5,605,468 B which is incorporated herein by reference. Reference is also made to "Thin-film thermoelectric devices with high room-temperature figures of merit" by R. Venkatasubramanian et al., Nature, volume 413, pages 597 to 602 (2001) which is incorporated herein by reference.

The device can also be cooled to 50 K using three stages based on multilayer quantum well films of p-type B$_4$C/B$_9$C combined with a multilayer quantum well of n-type Si/SiGe, such as that described in U.S. Pat. No. 7,038,234 B which is incorporated herein by reference.

Superlattice-based cooling devices are specially adapted for cooling silicon chips.

Moreover, such superlattice-based cooling devices can exhibit a value of K.T (where K is a thermal-conductivity and T is absolute temperature) of about 3.5, which is better than bulk materials. Furthermore, superlattice-based devices can provide more efficient cooling. For example, superlattice-based devices can develop a temperature difference, $\Delta T$, of about 240 K compared with about 30 K for bulk materials. The value of KT can be further improved by using quantum wire superlattices so provide even more efficient cooling.

Referring to FIGS. 8a, 9a to 9k and 10, reverse-side processing of the substrate 26 for fabricating the back gate 12 (FIG. 1) and an optional thermoelectric cooler 15 (FIG. 1) will now be described.

Figure 8A:
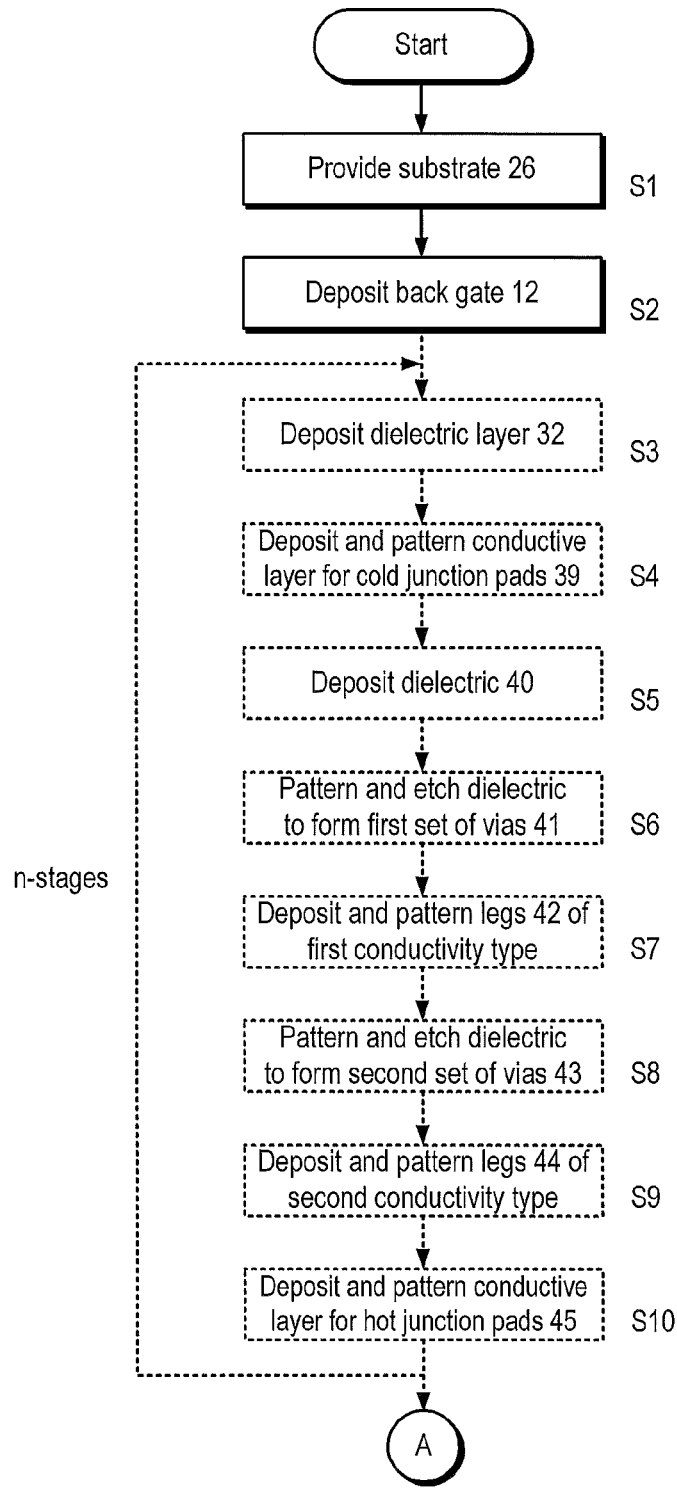
FIG. 8a is flow diagram of a reverse-side processing of a substrate for fabricating a device.
Figure 9:
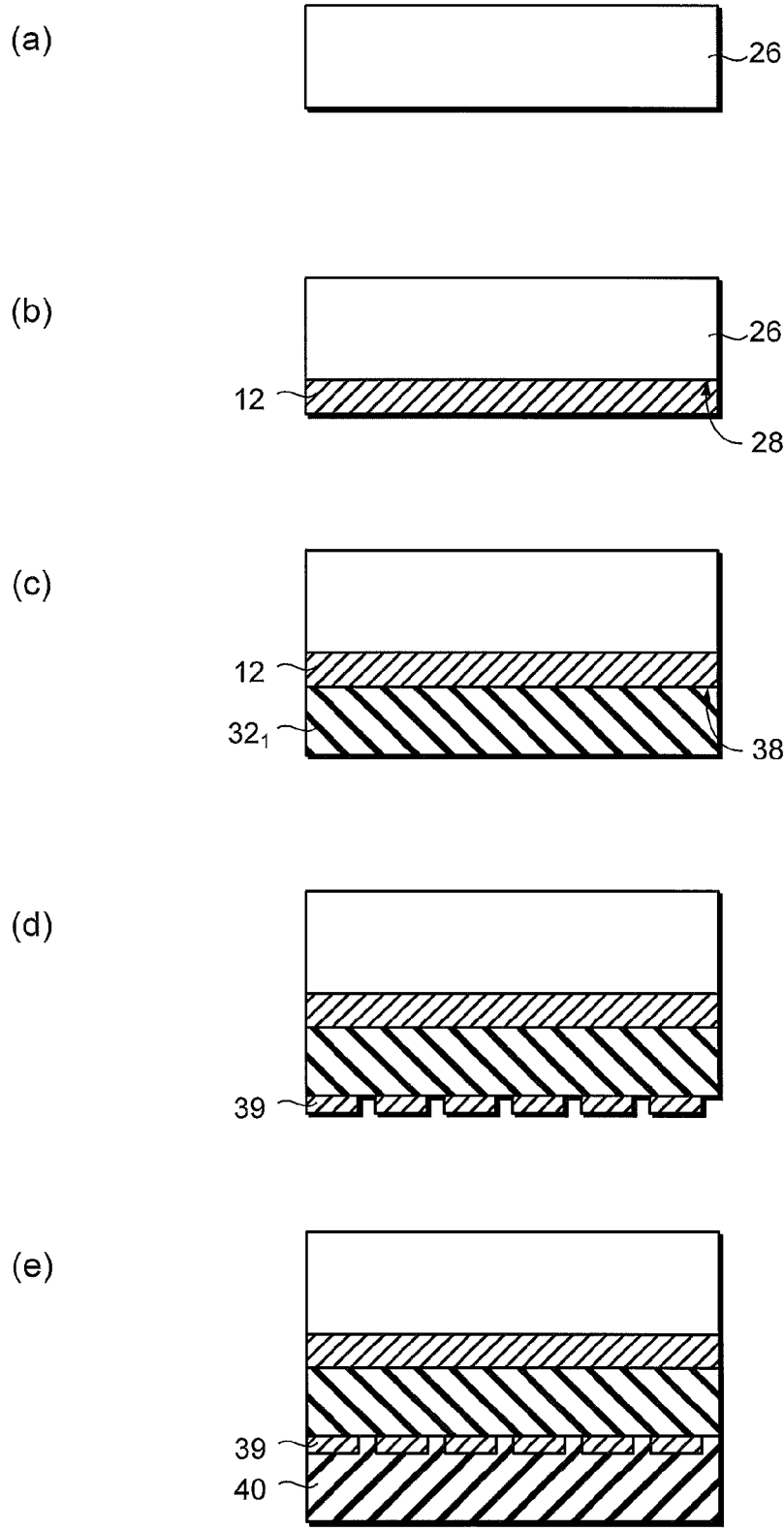
FIGS. 9a to 9k illustrate a device at various stages during fabrication.
Figure 9:
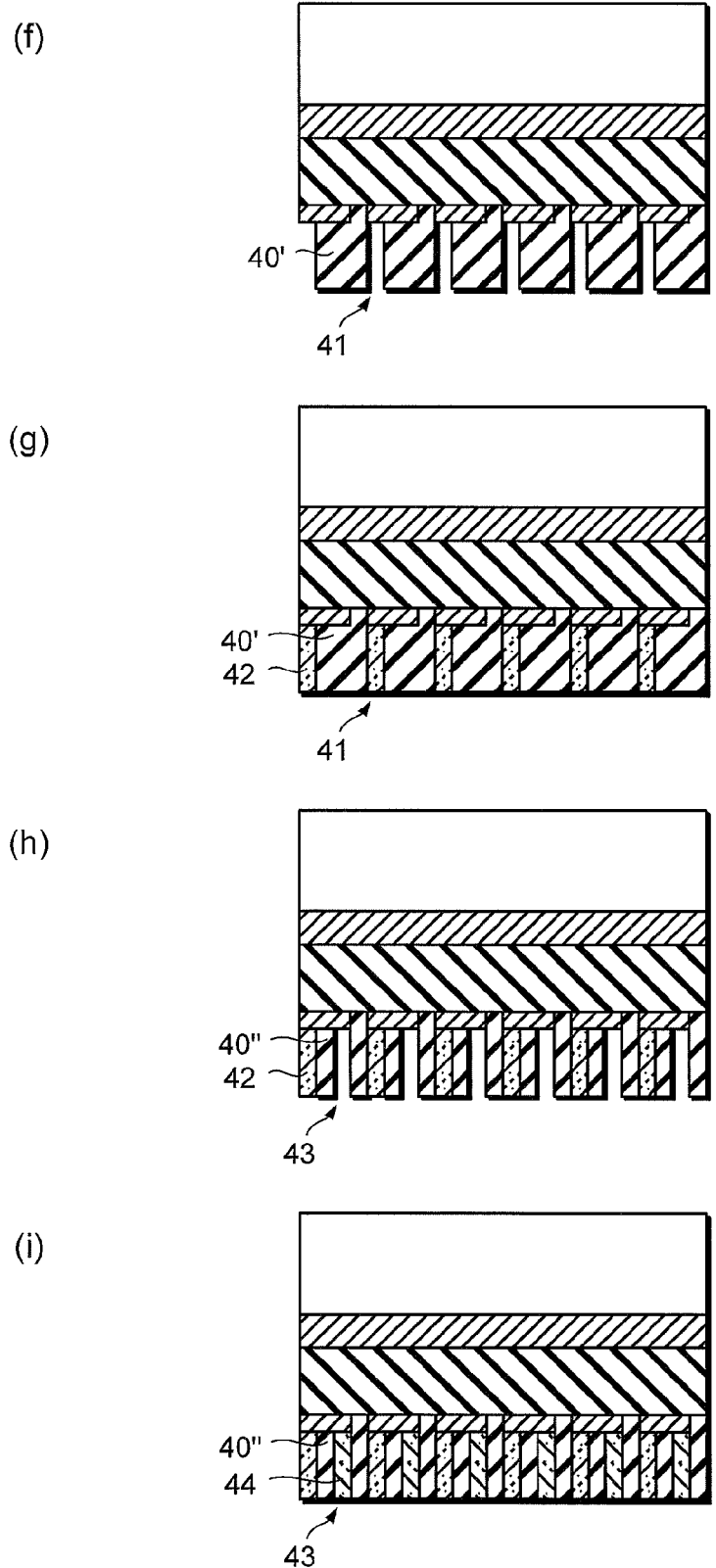
Figure 9:
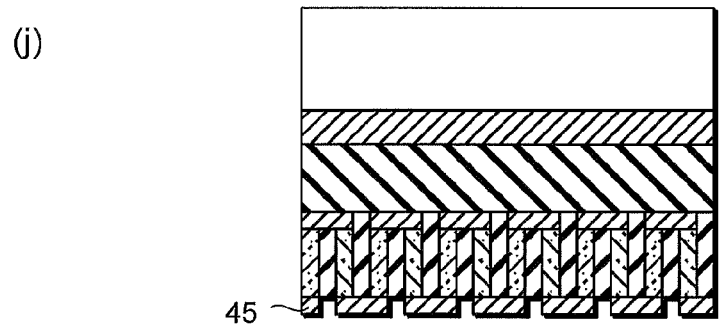
Figure 9:
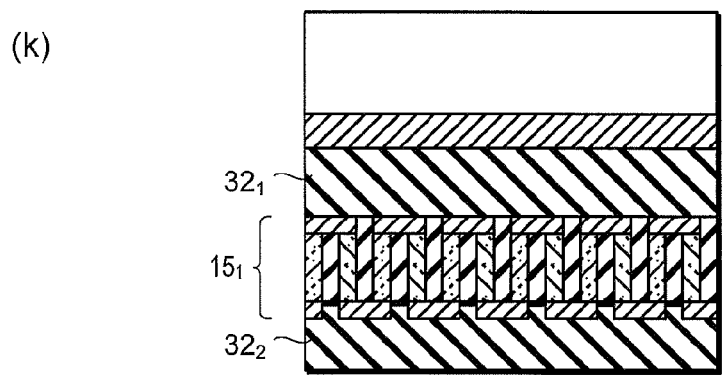

Referring to FIGS. 8a and 9a, a high resistivity semiconductor substrate 26 is provided (step S1) and cleaned using a conventional Radio Corporation of America (RCA) cleaning process.

Referring to FIGS. 8a and 9b, on the reverse side 28 of the substrate 26, a layer 12 of conductive material is deposited to form a back gate (step S2).

In this example, the conductive material is aluminium (Al) and is deposited by thermal evaporation. The layer can have a thickness between about 100 nm and 1 µm. Other metals or metal alloys can be used. More than one layer, including a gate dielectric layer, may be used. In some embodiments, the conductive material may comprise a semiconductor material, such as highly-doped n-type crystalline or polycrystalline silicon, for example, doped with phosphorous or arsenic. Thicker or thinner layers may be used.

As explained earlier, an on-chip, multi-stage cooler 15 can be provided. Two-stages can be used to cool the devices 2 (FIG. 1) to about 70 K and three stages can be used to cool them to about 30 K.

Referring to FIGS. 8a and 9c, a layer 32 of dielectric material, such as silicon dioxide, is deposited over the surface 38 of the back gate 12 (step S3). For example, the layer 32 can have a thickness between about 50 nm and 500 nm. If a high-k dielectric is used, then a thinner layer can be used.

Referring to FIGS. 8a and 9d, a layer (not shown) of conductive material, such as highly-doped n-type polycrystalline silicon, is deposited, for example by chemical vapour deposition (CVD) and is patterned by photolithography and wet etching to define a plurality of conductive pads 39 which will form a cold side of the thermoelectric stage (step S4). The layer of conductive material may have a thickness of about 5 µm.

Referring to FIGS. 8a and 9e, a layer 40 of insulating material, such as silicon dioxide, is deposited, for example by CVD (step S5). The layer 40 may have a thickness of, for example, about 100 µm, i.e. thick enough to accommodate the conductive pads (e.g. about 5 µm) and the subsequently deposited superlattices (e.g. about 100 µm).

Referring also to FIG. 9f, the layer 40 is patterned by photolithography and wet etching to define a first set of vias 41 in a patterned insulating material layer 40' (step S6).

Referring to FIGS. 8a and 9g, a first set of layers (not shown) forming at least 100 superlattices of a first type, such multiple layers of p-type B$_4$C and B$_9$C, separated from each other by a layer of undoped silicon are deposited and patterned to form p-type legs 42 in the vias 41 (step S7). Each superlattice may comprise depositing 95 pairs of layers of B$_4$C and B$_9$C, each layer having a thickness of about 10 nm. The interposed silicon layers each have a thickness of about 50 nm. Thus, the first set of layers has a total thickness of at least 100 µm.

Referring also to FIG. 9h, the patterned layer 40' of insulating material is patterned further to define a second set of vias 43 in a further patterned insulating material layer 40" (step S8).

Referring to FIGS. 8a and 9i, a second set of layers (not shown) forming at least 100 superlattices of a second type, such multiple layers of n-type Si and SiGe, separated from each other by a layer of undoped silicon are deposited and patterned to form n-type legs 44 in the vias 43 (step S9).

The number of superlattices and the number of layers in each superlattice can vary. For example, up to 600 or more superlattices can be used and/or up to 1250 or more pairs of layers can be used. Thus, legs can be as long as 15 mm or more.

Referring to FIGS. 8a and 9j, a layer (not shown) of conductive material, such as highly-doped n-type polycrystalline silicon, is deposited and patterned to define a plurality of conductive pads 45 which will form a hot side of the thermoelectric stage (step S10).

Thus, a first thermoelectric stage $15_1$ is formed.

Referring to FIGS. 8a and 9k, step S3 is repeated by depositing another thick layer 32 of insulating material and steps S4 to S10 are repeated using the same or different thermoelectric materials to form a second thermoelectric stage.

Figure 10:
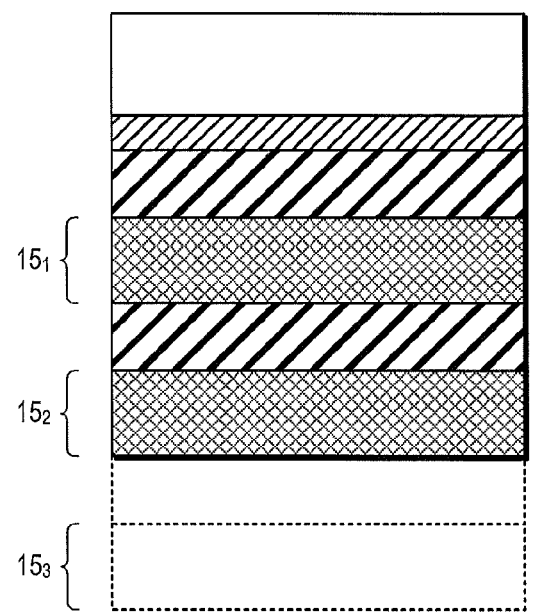
FIG. 10 is a sectional view of a device illustrating multiple stages of an arrangement for cooling the device.

The corresponding structure which includes two or more stages $15_1$, $15_2$, $15_3$ is shown in FIG. 10.

Referring to FIGS. 8b, 11a to 11p, 12, 13a, 13b 14a and 14b, front-side processing of the substrate 26 for fabricating the devices 2 will now be described.

Figure 11:
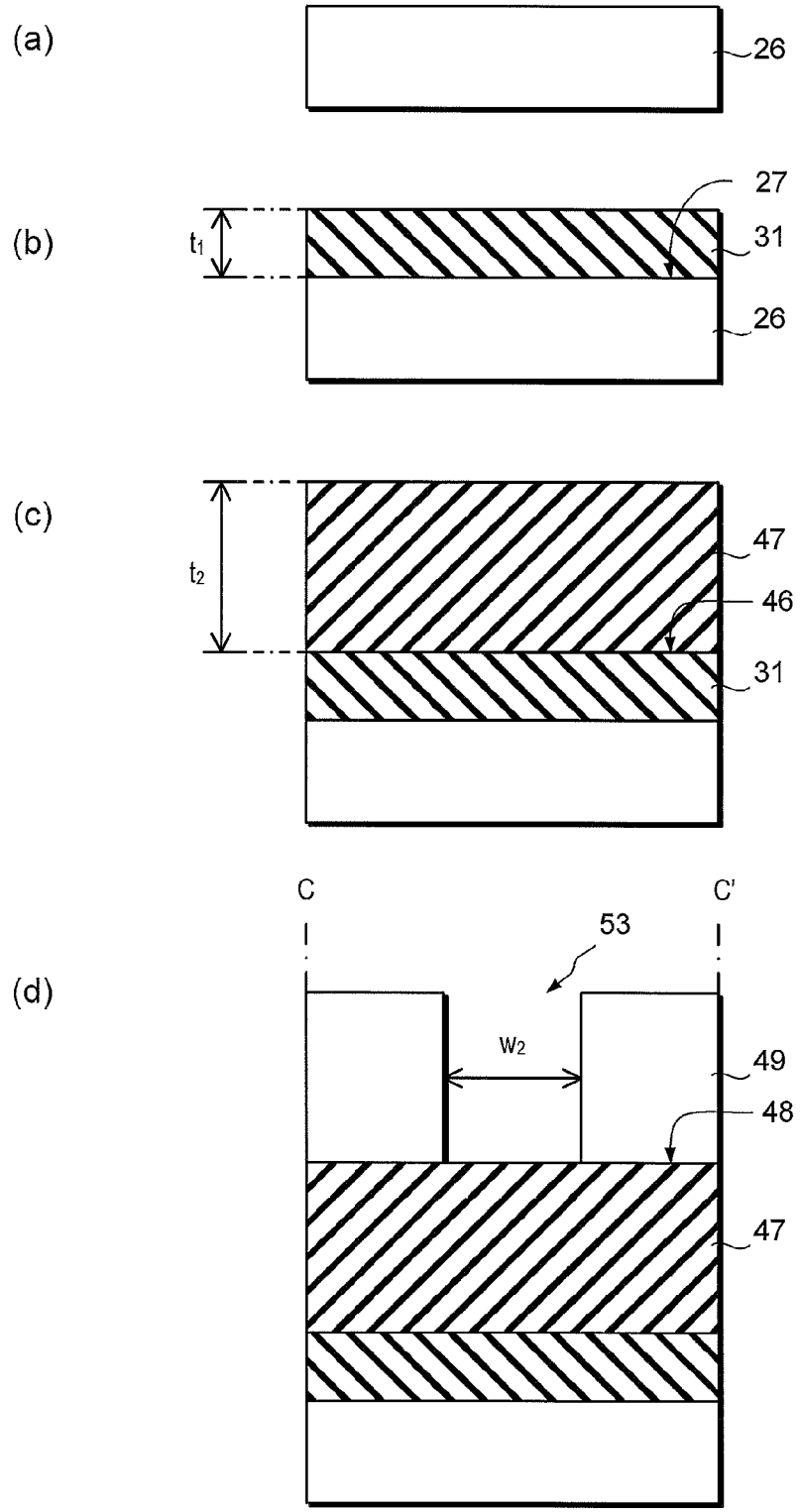
FIGS. 11a to 11p illustrate a device at various stages during fabrication.
Figure 11:
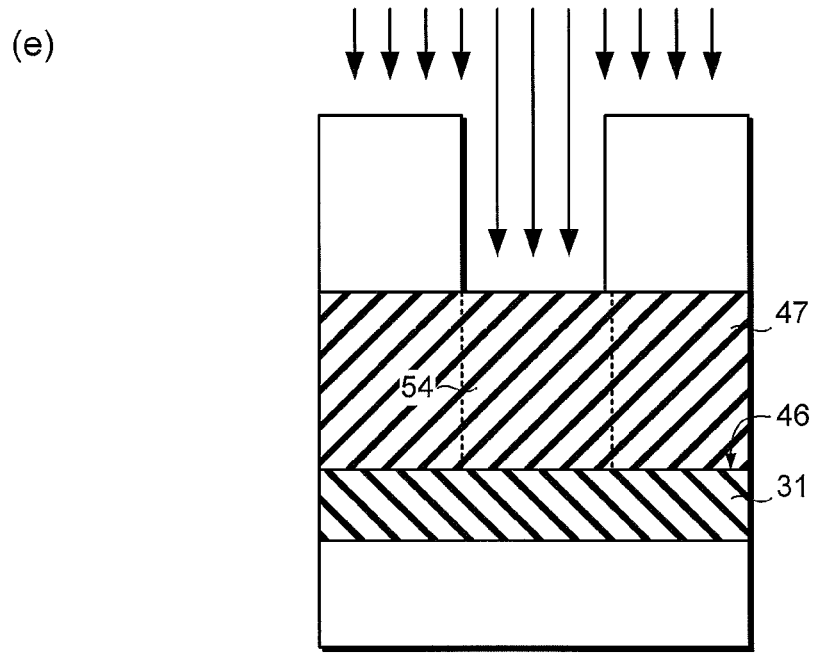
Figure 11:
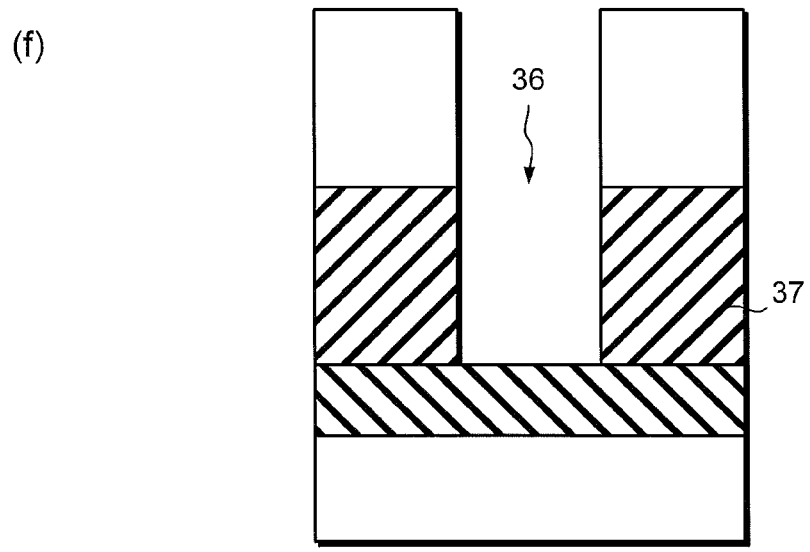
Figure 11:
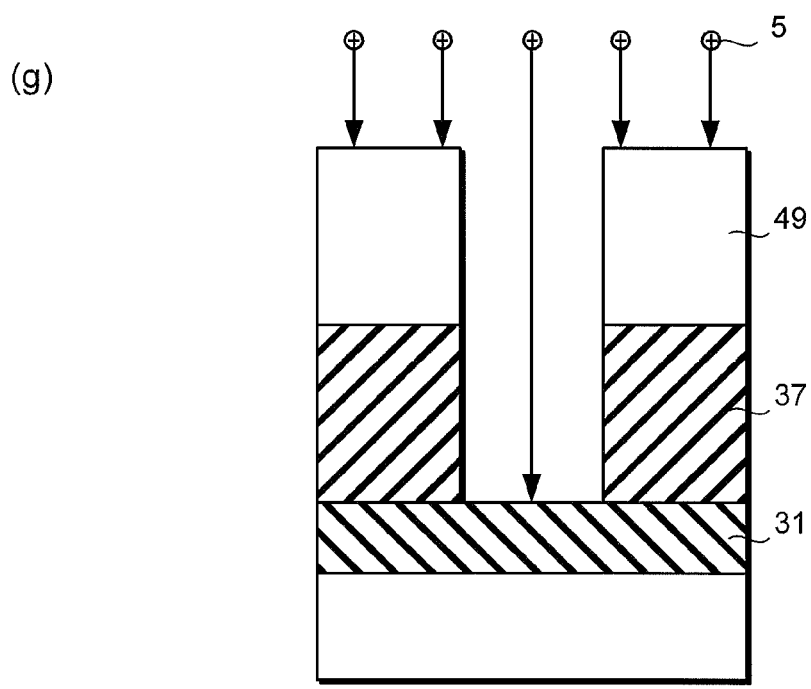
Figure 11:
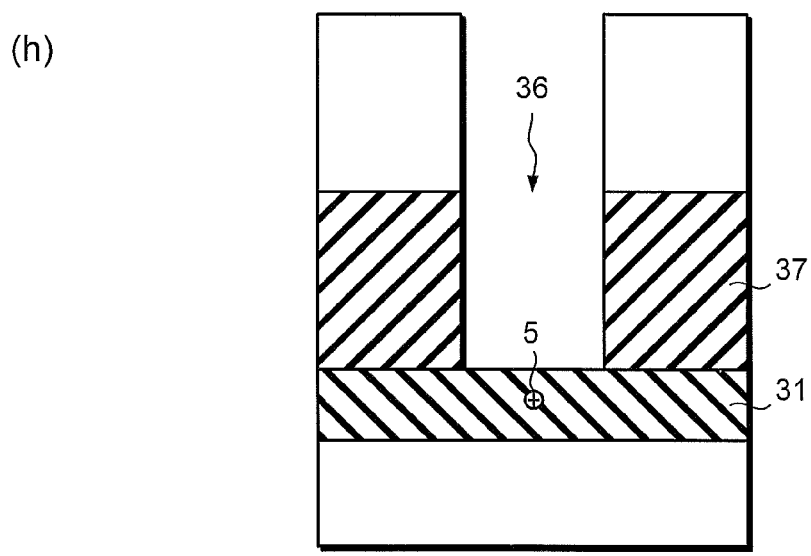
Figure 11:
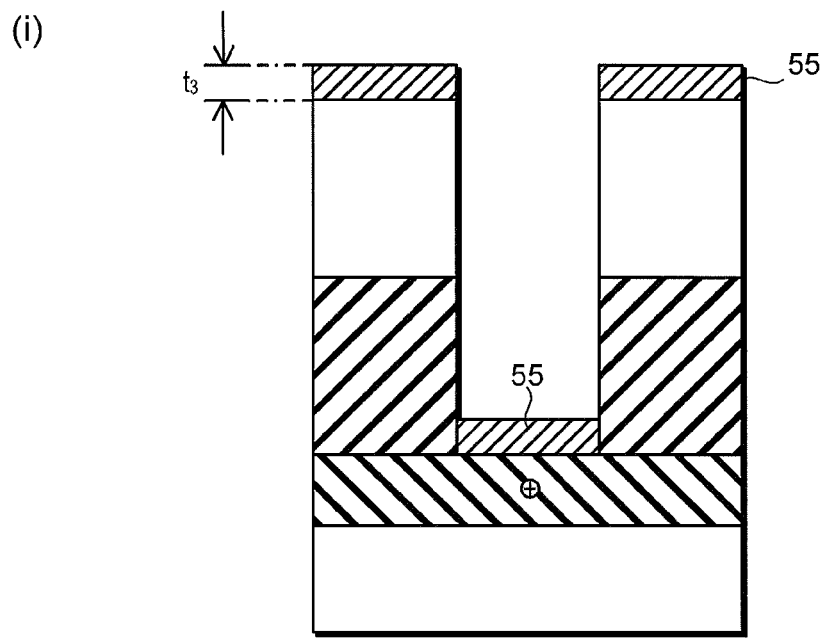
Figure 11:
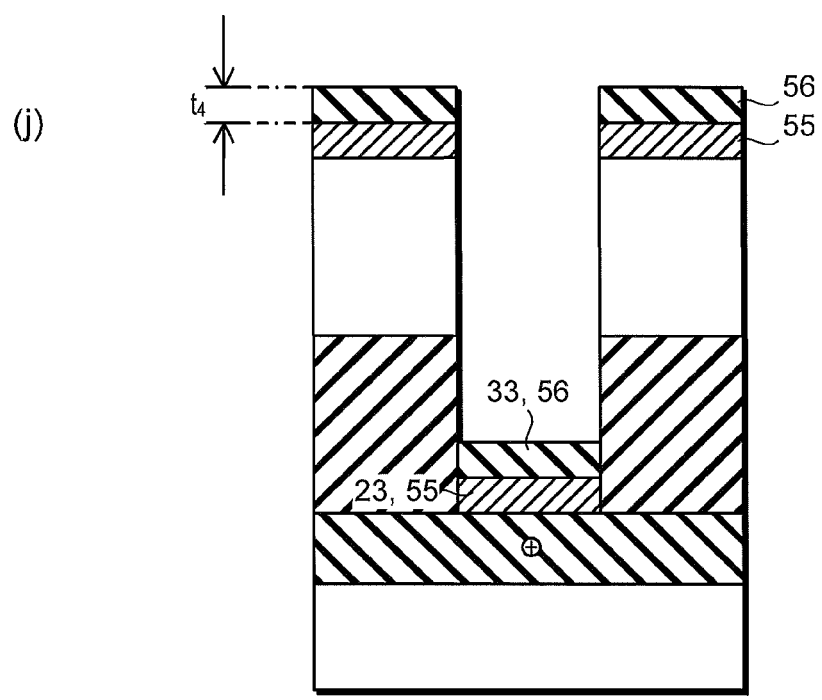
Figure 11:
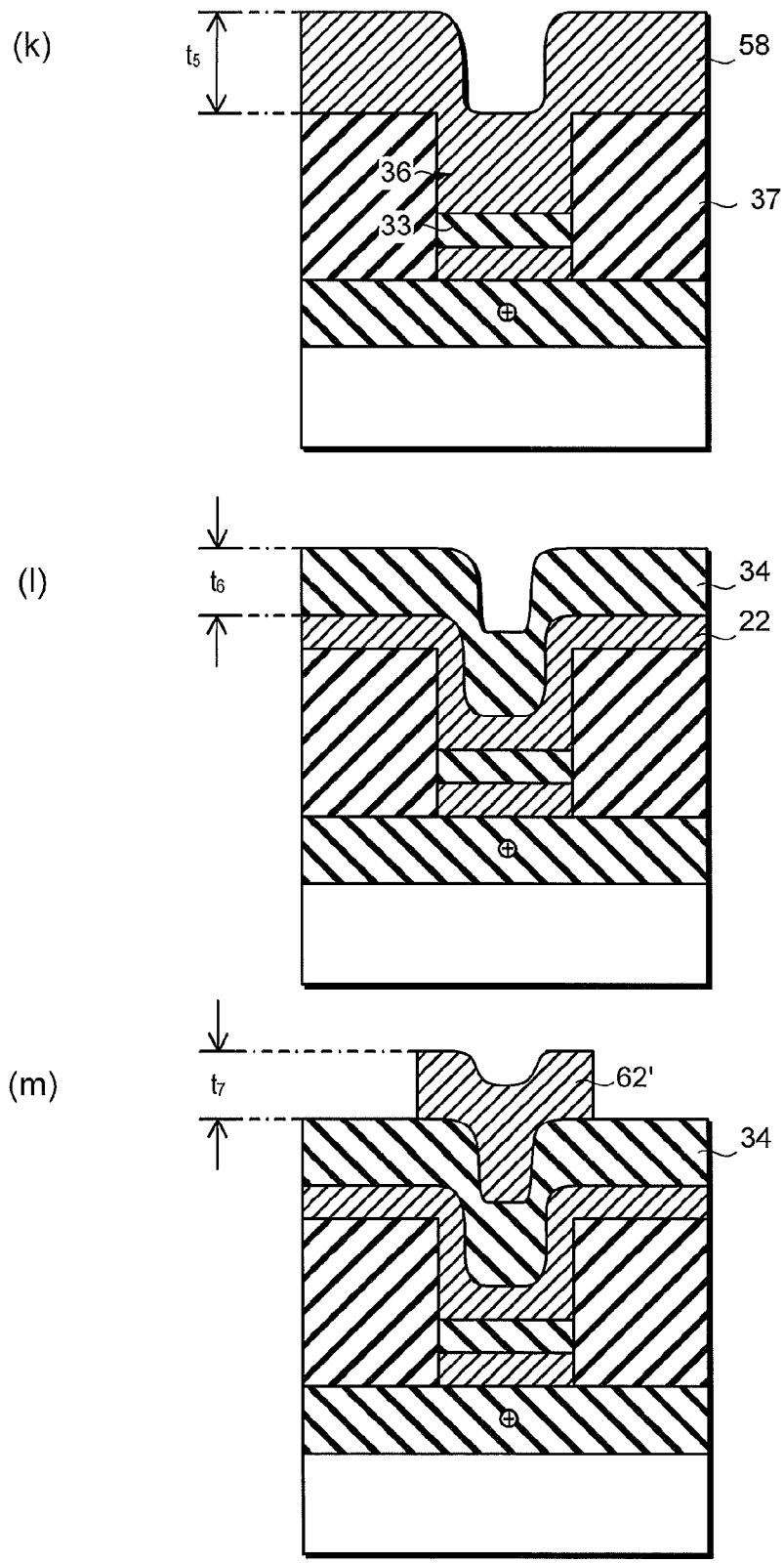
Figure 11:
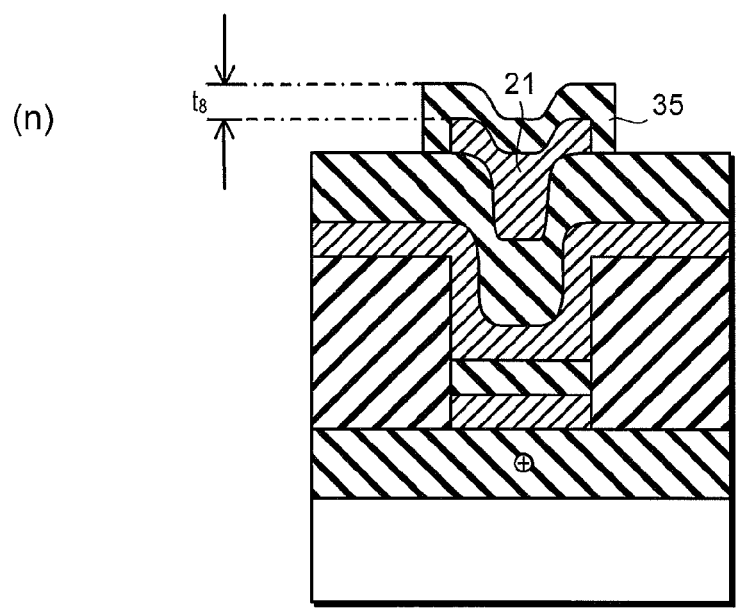
Figure 11:
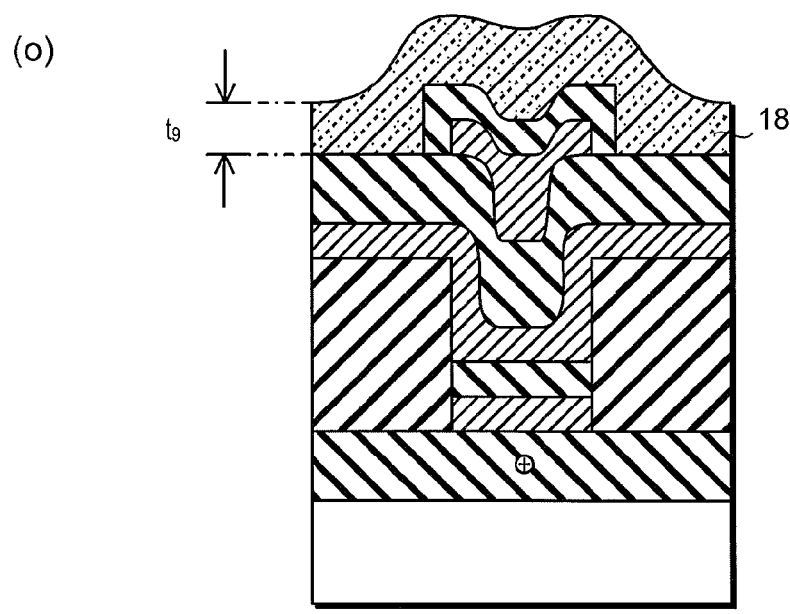
Figure 11:
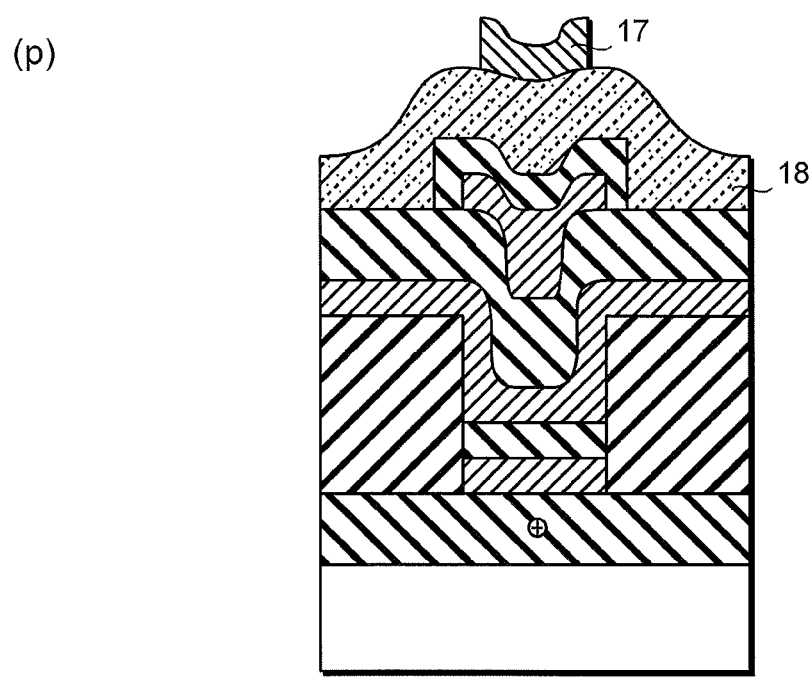

Referring to FIG. 11a, the high resistivity semiconductor substrate 26 (which may or may not be provided with a thermoelectric cooler 15) is cleaned.

Figure 8B:
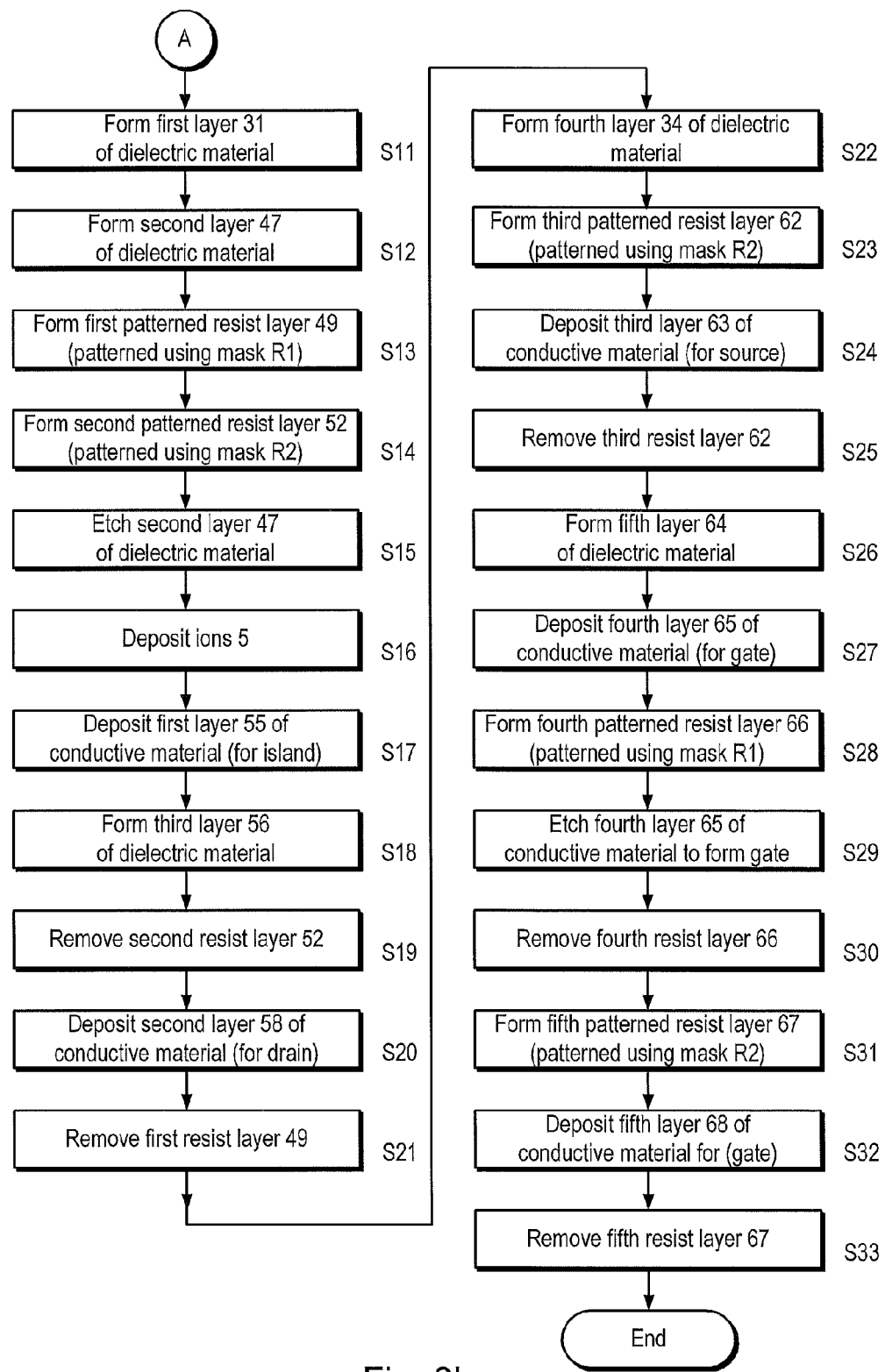
FIG. 8b is flow diagram of a front-side processing of a substrate for fabricating a device.

Referring to FIGS. 8b and 11b, on the front side 27 of the substrate 26, a first layer 31 of dielectric material is deposited (step S11). As explained earlier, in this example, the dielectric material is silicon dioxide ($SiO_2$) and has a thickness, $t_1$, of about 40 nm.

Referring to FIGS. 8b and 11c, on an upper surface 46 of the first layer 31 of dielectric material, a second layer 47 of dielectric material is deposited (step S12). In this example, the dielectric material is silicon nitride ($Si_3O_4$). The second dielectric layer 47 has a thickness, $t_2$, of about 130 nm.

The second layer 47 is then patterned. In this example, electron-beam lithography (employing electron-beam resists) is used.

Referring to FIGS. 8b, 12 and 13a and 13b, on an upper surface 48 of the second layer 47 of dielectric material, a first layer (not shown) of resist is applied and patterned with a first mask, R1, to define a first patterned resist layer 49 (step S13).

The first patterned resist layer 49 defines a first parallel set of elongate windows 50 (herein also referred to simply as "lines") in the resist having a width $w_1$.

Referring also to FIGS. 11d and 13a (which show the same structure), a second layer (not shown) of positive resist is applied and patterned with a second mask, R2, to define a second patterned resist layer 52. The second patterned resist layer 52 defines another set of lines 53, rotated with respect to the first set of lines 50 by 60°. In the second set, each line has a width $w_2$. Thus, in this example, $w_1=w_2$. In this example, $w_1=w_2=(a/2)\approx 20$ nm (where a is the distance between two neighbouring node). Thus, the lines are 50, 54 are separated from adjacent lines in the same set by $(a/2)\approx 20$ nm. Thus, the storage density is about $6\times 10^{12}$ $cm^{-2}$.

Referring in particular to FIG. 12, the combination of the two patterned resist layers 49, 52 is to leave a lozenge-shaped window 54. Only one window 64 is shown for clarity.

Referring to FIGS. 8b and 11e, a portion 54 of the second layer 47 of dielectric material is etched using reactive ion etching (RIE) using, for example, $CF_4$ and $O_2$, as a feed gas. The second dielectric material layer 47 is etched through to the surface 46 of the underlying first dielectric material layer 31. The resulting structure is shown in FIG. 11f and includes a hole or via 36 formed in a patterned dielectric material layer 37.

Referring to FIGS. 8b and 11g, without removing the resist layers 49, 52 (FIGS. 12 & 13), ions 5 are introduced into the first dielectric material layer 31 by depositing the ions 5 onto the first dielectric material layer 31 and allowing the ions 5 to diffuse into the layer 31 (step S16). In this example, the ions 5 are deposited by evaporating sodium (Na) so as to provide ions 5 of sodium ($Na^+$). The ions 5 need not be evaporated, but can be applied in solution (e.g. sodium chloride) or implanted using low-energy (e.g. a few keV) ion-beam implantation.

The ion concentration is chosen so that distance between deposited impurities is about twice the width ($w_1$, $w_2$) of the trenches 50, 53 (FIG. 12).

The resulting structure is shown in FIG. 11h and shows an ion 5 located in the first dielectric material layer 31 beneath the hole 36 in the patterned second dielectric material layer 37.

Using a self-aligned method, the single-electron electrometer 9 (FIG. 1) is formed over the ion 5, inside the hole 36. In this example, the single-electron electrometer 9 comprises conductive regions which are formed of gold (Au) and titanium (Ti) and insulating regions which are formed of titanium oxide ($TiO_2$). The conductive regions are patterned using a lift-off process using a resist and the insulating regions are formed either by depositing a layer of dielectric material or by oxidizing the exposed surface of a conductive layer.

Referring to FIGS. 8b and 11i, a first layer 55 of conductive material is deposited over the resist layers 49, 52 (step S17). The conductive material is gold and is deposited by thermal evaporation. The layer 55 has a thickness, $t_3$, of about 20 nm.

Metals other than gold and metal alloys can be used. For example, a metal, such as titanium, or a metal alloy can be used which can be controllably oxidized to form a surface oxide but which, under ambient conditions, either only forms a thin surface oxide or does not form a surface oxide at all. Thus, the need for depositing a layer of dielectric material can be avoided. However, subsequent fabrication stages may need to be modified. Furthermore, the conductive material can be a semiconductor, such as heavily-doped polysilicon silicon. If a semiconductor is used, then a thin diffusion barrier layer, such as a layer of silicon nitride or silicon oxide, can be deposited prior to depositing the layer of semiconductor.

Referring to FIGS. 8b and 11j, a third layer 56 of dielectric material is formed on or at the surface of the first layer 55 of conductive material (step S18). The third layer 56 of dielectric material forms the dielectric layer 33 which provides the tunnel barriers 24, 25 (FIG. 2). As explained earlier, in some embodiments, the dielectric layer 33 need not be formed by depositing a layer 56 of dielectric material, but can be formed by oxidizing and sacrificing some of the underlying layer of a suitable conductive material (such as titanium) so as to form the dielectric layer 33 and the island 23.

In this case, the third layer 56 of dielectric material is formed by depositing a layer of dielectric material, such as titanium oxide, for example using atomic layer deposition (ALD). In this example, the dielectric layer has a thickness, $t_4$, of about 2 nm.

The dielectric material layer 56 should be sufficiently thick so that the layer 56 can serve as a tunnel barrier, but not too thick so as to prevent tunnelling.

Referring to FIG. 8b, the second patterned resist layer 52 is stripped in a solvent (step S19). This not only removes the resist layer 52, but also removes ("lifts-off") unwanted regions of the thinned layer 55' of conductive material and the third dielectric layer 56 which overlie the patterned resist layer 52.

A lift-off process need not be used. For example, an etching process may be used in which a layer of conductive material is deposited before depositing and patterning a resist. Unwanted regions of the conductive material layer, unprotected by the patterned layer of resist, can be etched. The process may be repeated for the dielectric material layer. Alternatively, the dielectric material layer may be deposited over the conductive material layer before depositing and patterning the resist.

Figure 14:
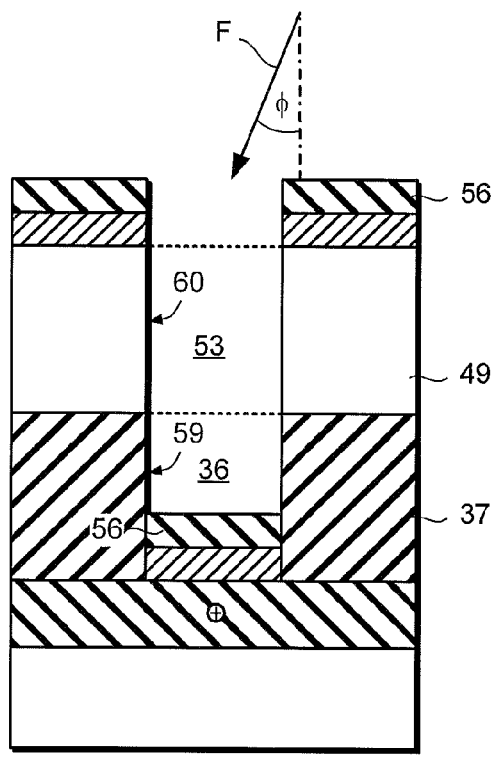
FIGS. 14a and 14b are cross sectional views of a device taken along the direction of the drain.
Figure 14:
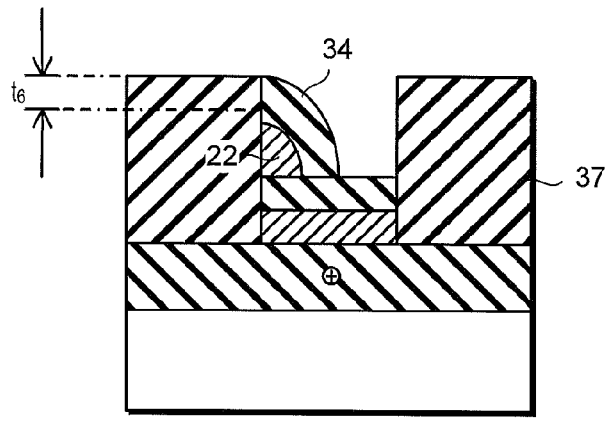

Referring to FIGS. 8b, 11k and 14a, a second layer 58 of conductive material is deposited over the third dielectric material layer 56 and exposed regions of the patterned dielectric layer 37 (step S20). The conductive material is titanium and is deposited by angled thermal evaporation. The layer has a thickness, $t_5$, of about 10 nm.

As shown in FIG. 14a, the partially-processed device and the evaporation source (not shown) are angled with respect to each other so that the flux, F, of the conductive material is directed onto one side 59 of the hole 36 and one side 60 of the resist window 53.

Referring to FIG. 8b, the first resist layer 49 is stripped (step S21). Again, this not only removes the resist layer 49, but also lifts-off unwanted regions of the conductive material layer 58 overlying the resist layer 49, including the side 60 of the resist window 53.

Referring to FIGS. 8b, 11l and 14b, a fourth layer 34 of dielectric material is selectively formed over or at the surface of the remaining portions of the second conductive material layer so as to form the drain 22 (step S22). The fourth dielectric material layer 34 is formed by oxidizing the exposed surface of remaining titanium layer 58 in dry oxygen. As shown in FIG. 14b, a surface region of the titanium layer is consumed to form the dielectric material layer 34 and isolate the remaining titanium which forms the drain 22. In this example, the dielectric layer has a thickness, $t_6$, of about 6 nm. Thus, about 2 nm of titanium is consumed to form a layer of titanium oxide having a thickness of about 6 nm.

If the third layer of dielectric material 56 (FIG. 11j) comprises a material, such as titanium oxide, which is formed by sacrificing the underlying conductive layer, e.g. by oxidation, then the first resist layer 49 is not stripped at this stage so as to protect against forming a source-island barrier which is too thick.

The fourth layer 34 of dielectric material may be formed by depositing a layer of dielectric material. The dielectric material layer 34 should be sufficiently thick (for a given permittivity) so as to insulate the source 21 (FIG. 2) and drain 22 from each other and so prevent tunnelling between them during normal operation of the single-electron electrometer 9. Thus, the minimum thickness of the dielectric material layer 34 differs depending on whether titanium oxide, silicon dioxide or a high-k dielectric material is used.

Referring to FIG. 8b, third layer (not shown) of resist is applied and patterned with the second mask, R2, so as to form a third patterned resist layer 62 (step S23).

Referring to FIGS. 8b and 11m, a third layer 63 of conductive material is deposited over the resist and exposed areas of the third and fourth dielectric layers 33, 34 (step S24). The conductive material is titanium and the layer has a thickness, $t_7$, of about 50 to 100 nm depending on geometry.

Referring to FIG. 8b, the third resist layer 62 is stripped (step S25).

The corresponding structure, including a patterned layer 62' of conductive material formed on the fourth dielectric layer 34, is shown in FIG. 11m.

Referring to FIGS. 8b and 11n, a fifth layer 64 of dielectric material is selectively formed over or at the surface of the layer 62' (FIG. 11m) of conductive material so as to define the source 21 (step S26). In a similar way to step S18, this can be achieved by oxidizing the titanium in dry oxygen, although it can be formed by deposition. The layer 64 has a thickness, $t_8$, of about 10 nm.

Referring to FIG. 8b, a fourth layer 65 of conductive material is deposited (step S27). The conductive material is a semiconductor and comprises polycrystalline silicon deposited by a chemical vapour deposition (CVD) process. The polycrystalline silicon layer 65 has a thickness, $t_9$, of about 100 nm.

Referring still to FIG. 8b, a fourth layer of resist (not shown) is applied and patterned with a first mask, R1, so as to form a fourth patterned resist layer 66 (step S28). In this case, the resist is a negative resist.

Referring still to FIG. 8b, the polycrystalline silicon 65 is etched using reactive ion etching using, for example, $SF_6/O_2/CHF_3$ as a feed gas (step S29). The fourth resist layer 66 is stripped (step S30). The resulting structure, including gate 18, is shown in FIG. 11o.

Referring to FIG. 8b, a fifth layer (not shown) of resist is applied and patterned with the second mask, R2, so as to form a third patterned resist layer 67 (step S31).

Referring to FIG. 8b, a fifth layer 68 of conductive material is deposited over the resist and exposed semiconductor gate 18 and third dielectric material layer 37 (FIG. 5) (step S32). The metal can be aluminium and the layer has a thickness of about 100 nm or more.

Referring to FIG. 8b, the fifth resist layer 67 is stripped (step 33).

The corresponding structure, including gate 17 crossing the poly-silicon gate 18, is shown in FIG. 11p.

It will be appreciated that further processing steps may be included. Furthermore, at least some of the control circuit 13 (FIG. 1) may be formed simultaneously while forming the devices 2.

Figure 15:
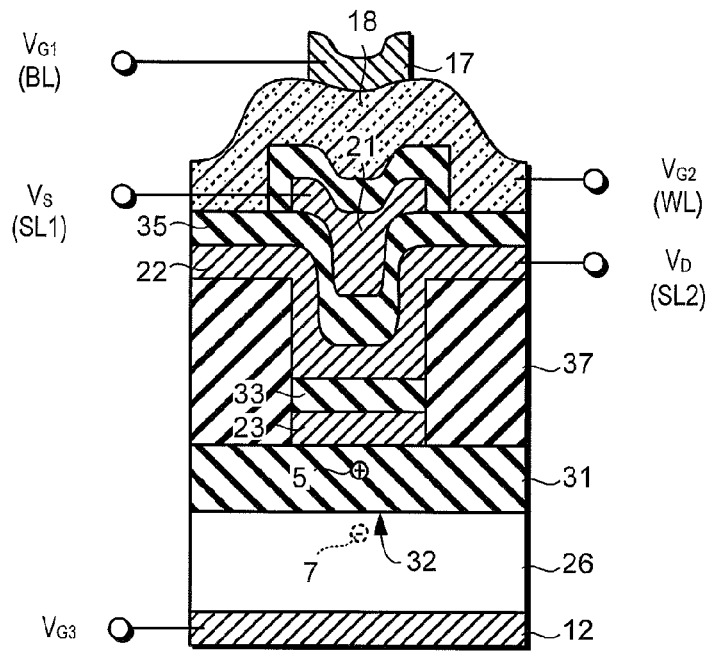
FIG. 15 illustrates biases applied to a device.

Referring to FIGS. 2 and 15, the bit and word lines 17, 18 in the vicinity of a device provide first and second gates 10, 11 for programming the node 4. In this example, the first gate 10 comprises a metal and second gate 11 comprises a lightly-doped semiconductor. Therefore, applying a gate bias, $V_{G1}$, to the metal gate 10 alters the potential in the semiconductor gate 11. A combination of gate voltages, $V_{G1}$, $V_{G2}$, applied to the bit and word lines 17, 18 can be used to apply a sufficiently large electric field to the node 4 in order to program the node 4.

As explained earlier, each memory device 2 includes an ion 5 which is located in a region of dielectric region 6. The ion 5 can be mobile at temperature above the operating temperature of the memory device 2 and so can be manipulated.

While the chip 3 is not being cooled (or is being heated), the gates 10, 11, 12 can be used to repel (or attract) the ion 5. Thus, the ion 5 can be moved through the dielectric region 6 in a given direction, e.g. vertically (along a z-axis).

When the ion 5 is suitably positioned, the chip 3 can be cooled (or heating stopped) so that the temperature of the device falls below a glass transition temperature $T_g$. The ion 5 is then frozen in position. For electrons in silicon which contains impurities, the glass transition temperature is about 120 K. The glass transition temperature for silicon is reduced due to the presence of impurities. For sodium ions in silicon or silicon dioxide, the glass transition temperature is expected to be between about 120 K and about room temperature 293 K.

The use of mobile ions 5 can have an advantage that ions 5 can be repositioned. Thus, if a sufficient number of memory devices 2 on a chip 3 are found not to work properly, then chip can be warmed up and re-cooled so as to reposition the ions. Therefore, the use of mobile ions 5 offers the potential of increasing yield.

Figure 16:
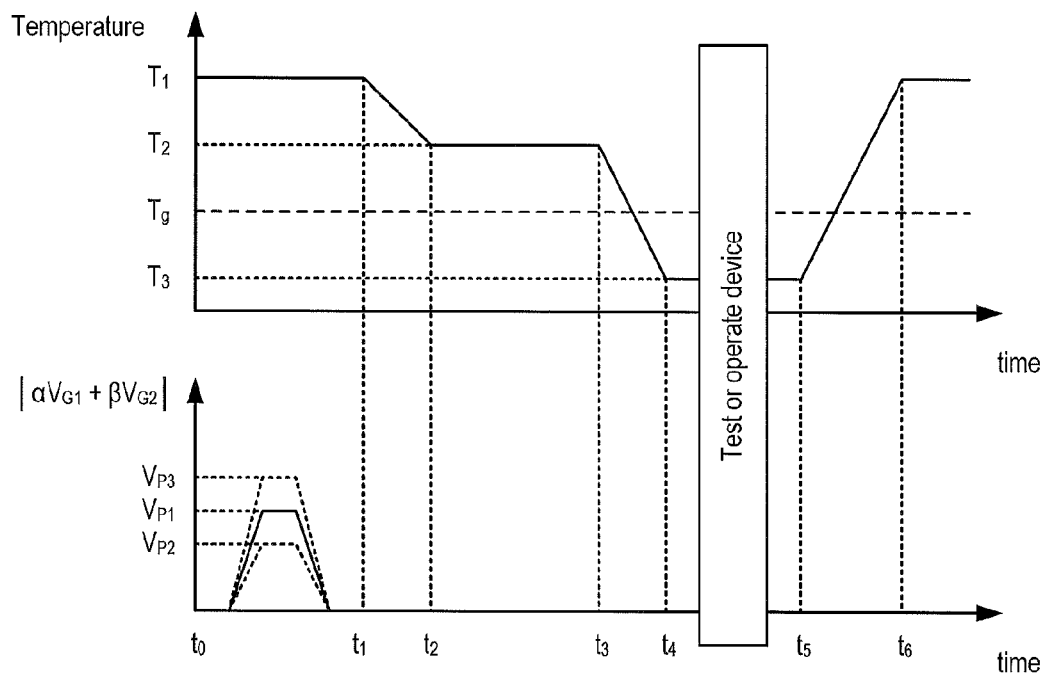
FIG. 16 illustrates preparing an array of ions.
Figure 17:
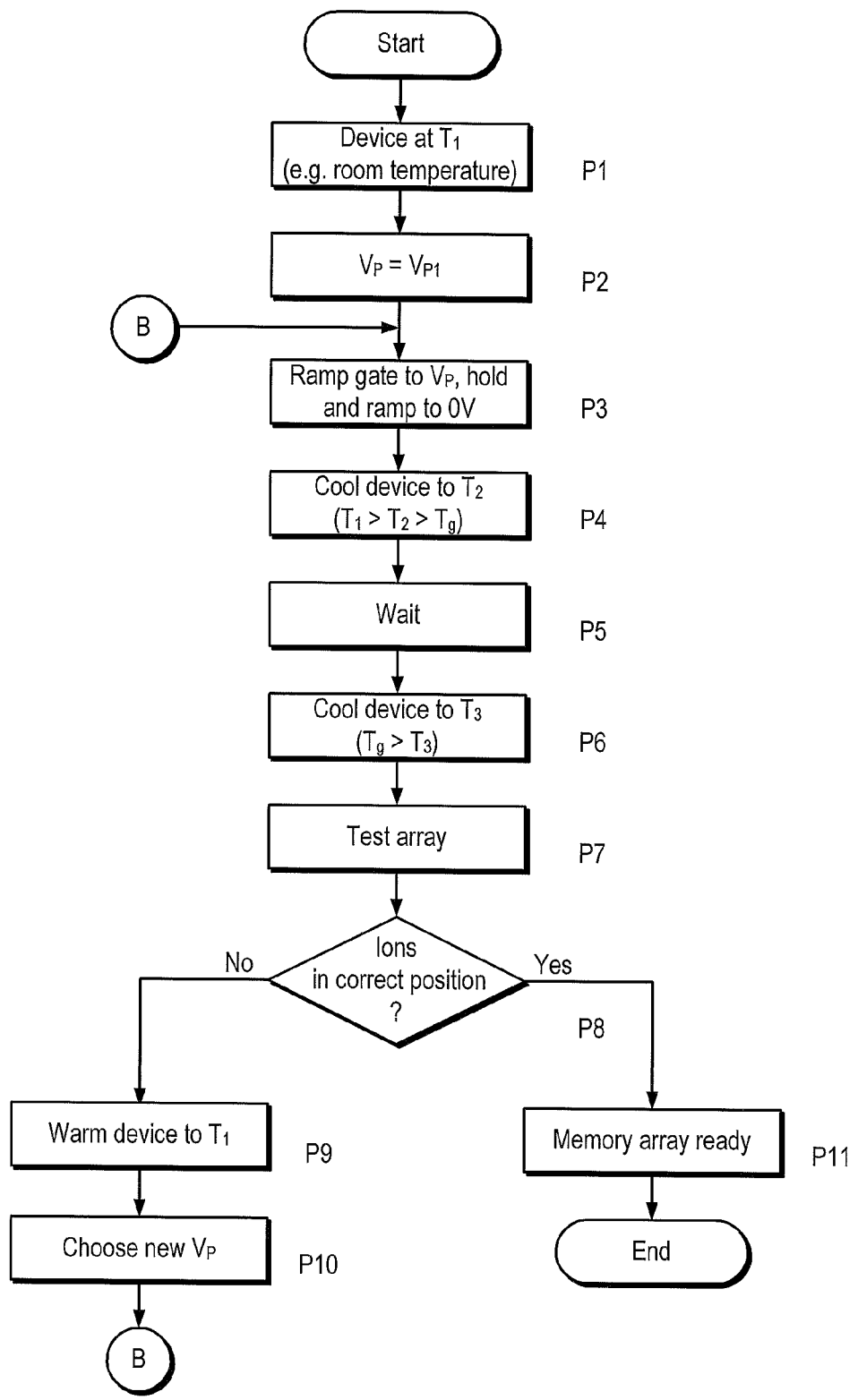
FIG. 17 is a process flow diagram of a process of preparing an array of ions.

Referring to FIGS. 15, 16 and 17, a method of preparing a device 2 for operation and in which mobile ions 5 are used will now be described.

The device 2 is at a temperature $T_1$ (step P1). In this example, temperature $T_1$ is room temperature (about 293 K). However, in other examples, depending on the dielectric material and the ion species, the temperature can be higher (or lower).

An initial set of values of gates voltages, e.g. $V_{G1}$ and $V_{G2}$, is chosen (step P2). The initial set of values may be obtained from a model or through experiment. The values may depend on, among other things, diffusion constant for the species in the dielectric region, temperature, dielectric constant of the dielectric material and geometry and dielectric constant of surrounding regions.

An effective gate voltage $V_P$ is used which is calculated as a sum of the $\alpha \cdot V_{G1}$ and $\beta \cdot V_{G3}$ (where $\alpha$ and $\beta$ are weights each taking a respective value between 0 and 1). An initial value $V_P = V_{P1}$ is chosen.

The gate voltages, $V_{G1}$, $V_{G2}$, are ramped up (in magnitude) until $V_P$ reaches the desired value. The gate voltages are held for a given time and then ramped back down (step P3). The process can be repeated more than once.

The device 2 is gradually cooled without any biases applied over a period of, for example a few hours, to an intermediate temperature, $T_2$, which is still above the glass temperature, $T_g$ (step P4). The device 2 is held at the intermediate temperature, $T_2$, for a period of, for example, a few hours (step P5). Gradual cooling can help the ions to arrange themselves before freezing.

The device 2 is gradually cooled further over a period of, for example a few hours, to an operating temperature, $T_3$, which is below the glass temperature, $T_g$ (step P6).

The array of devices 2 can be tested to check that they exhibit memory characteristics using suitable gate biases and electrometer biases and so infer that the ions are in the correct positions (steps P7 & P8). The array of devices 2 may fail in two ways.

Firstly, the devices may fail because, even though ions 5 are located at the correct distance from the interface 32, a lattice is not formed. This can be tested by determining whether the majority of electrometers 9 (FIG. 1) are working nominally in that they can detect a single electron. If it is found that the lattice has not been properly formed, then this can be corrected by warming the array to $T_2$, waiting and then re-cooling the array.

Secondly, the device 2 may fail because the ion 5 is not located at the correct distance from the interface 68. For example, even though the electrometers 9 (FIG. 1) are working correctly, they do not detect the correct number of bound electrons for a given set of gate voltages, $V_{G1}$ and $V_{G2}$. This indicates the presence of disorder. If the disorder arises as a result of unwanted charges traps at the semiconductor/dielectric interface, e.g. due to cooling down too quickly, then it may be possible to rectify this simply by carrying out several sweeps of gate bias. Alternatively, it may be possible to correct this by warming the array to $T_2$, waiting and then re-cooling the array.

If device 2 fails the test (or sufficient numbers of devices 2 fail the test), then the device(s) can be warmed up (step P9), new value(s) of $V_P$ can be chosen (step P10) and steps P3 to P8 repeated.

If the device 2 passes the test (or sufficient numbers of devices 2 pass), then the device(s) can be used (step P11).

A suitable position for the ions 2 and a value of the transition temperature can be found by experiment. For example, the distance from the interface 32 (FIG. 4) between the dielectric material layer 31 and the semiconductor layer 26 depends on ion concentration, ions species and thickness of the dielectric.

For a concentration of about $1 \times 10^{12}$ cm$^{-2}$ sodium ions and a $SiO_2$ layer having a thickness of about 40 nm, the ions 5 should be located about 25 to 30 nm from the $Si/SiO_2$ interface.

When cooled, under the indirect influence of repulsive electron-electron interaction, the ions undergo a phase transition and form a lattice. A perfectly-arranged lattice of ions is not necessary as the localised electrons in the semiconductor will arrange themselves more easily into a lattice. This is due to the electrons being localised underneath each ion but with a localisation length spreading over the next neighbour localised site.

Additionally or alternatively, microwave radiation can be used to control the position of localised electrons.

Single valence electron ions (such as $Na^+$) can be used to trap a single electron so as to form a charge-neutral D0 state. However, such ions can also be used to trap two electrons and so form a D_ state. For $Na^+$ in a $Si/SiO_2$ system, D0 and D_ states are expected to be separated by about 15 meV, which is equivalent to thermal energy at about 174 K. Therefore, reducing the temperature of the device below about 174 K can help to avoid thermally-activated switching between D0 and D_ state. However, in some embodiments, the formation of a D_ state can be used, as will be explained in more detail later.

Figure 18:
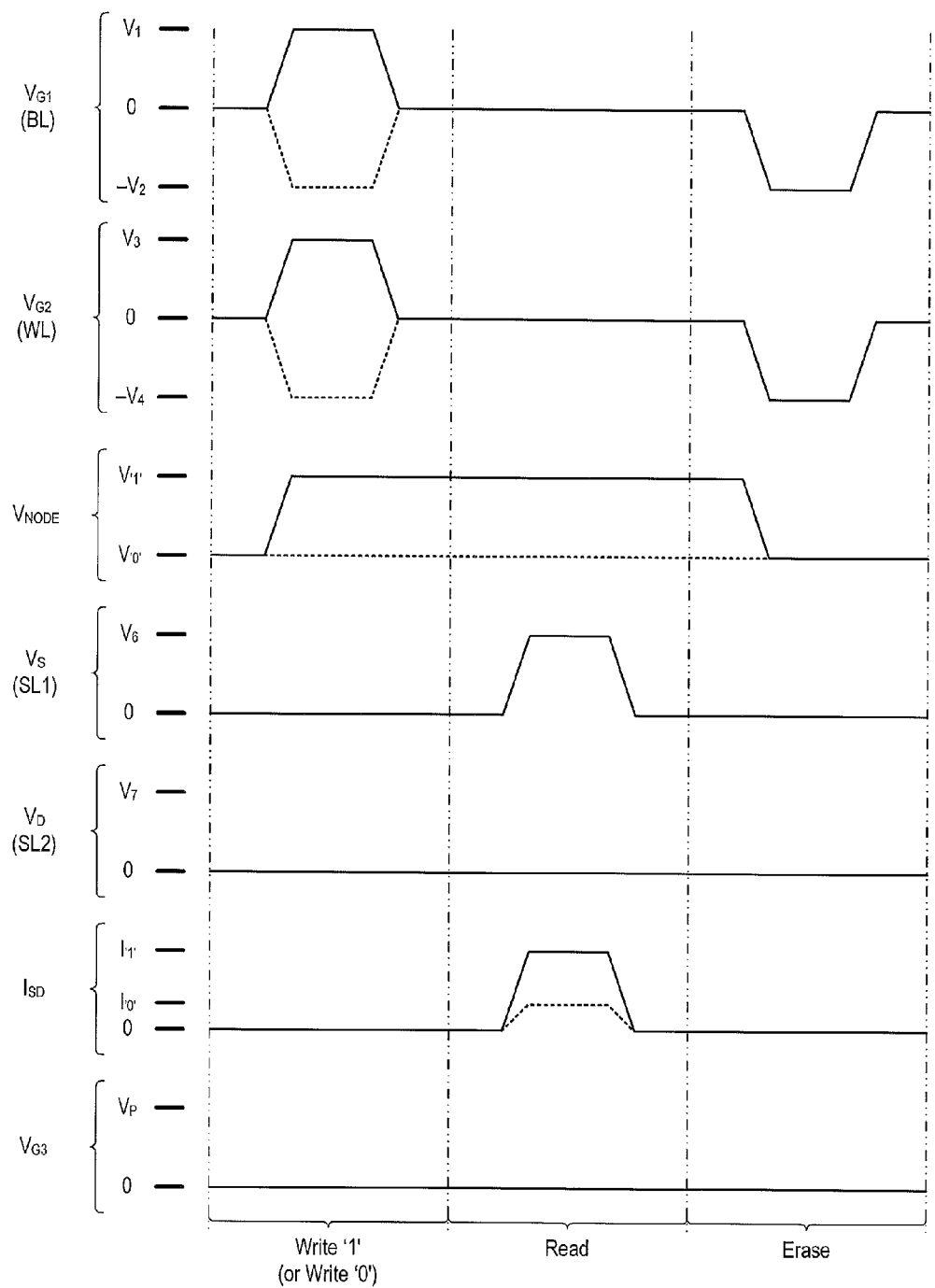
FIG. 18 show timing diagram for writing, reading and erasing data.

Referring to FIGS. 2, 15 and 18, operation of the device 2 will now be described. Application of gate biases $V_{G1}$, $V_{G2}$ to the gates 10, 11 can be used to control the local potential at the interface 68 between the semiconductor and dielectric layers 26, 31. Depending on the applied gate biases, there can be 0, 1 or 2 electrons 7. The variation in ionisation energy is of the order of 2 V between the 0 electron state and the 2 electron state. In the present example, only 0 and 1 electron states are described.

To program the node 4 so that one electron 7 is bound to the ion 5, a bias $V_1$ is applied to the bit line 17 and a bias $V_2$ is applied to the word line 18. In this example, the biases $V_1$, $V_2$ are negative. Values can be found by routine experiment.

However, biases which result in a local potential of about −2 V can be used to program trap one electron. Even without optimisation, hold times exceeding several months can easily be achieved and longer hold times, e.g. of the order years or tens of years, can be expected.

To program the node 4 so that no electron 7 is bound to the ion 5, a bias $V_3$ can be applied to the bit line 17 and a bias $V_4$ can be applied to the word line 18. In this example, the biases $V_3$, $V_4$ are negative. Values can be found by routine experiment. However, biases which result in a local potential which are more negative than −2 V can be used to erase the node. The program time is about 0.5 ns.

To read the node, a bias $V_6$ is applied to the first sense line 21, while the second sense line 22 is held at 0V. The current between through the electrometer 9 is measured to determine charge and, thus, state of the node 4. In particular, a current—gate voltage characteristic exhibits a peak (a "Coulomb peak") having a magnitude of, e.g. about 1 nA, against a background having a magnitude of, for example, about 0 nA. The peak corresponds to the situation when Coulomb blockade is lifted. The gate voltage is an effective gate voltage arising from the combination of voltages applied to the gates 10, 11. When there is no bound charge, the position of the peak is at a first value of effective gate voltage. The presence of a bound electron shifts peak to a second, different value of effective gate voltage. Therefore, if the electrometer is "tuned", e.g. to the first value of the effective gate voltage, then the absence or presence of a bound electron can be determined by measuring changes in current, e.g. of the order of 1 nA.

To erase the node, the bias $V_3$ is applied to the bit line 17 and the bias $V_4$ is applied to the word line 18. Alternatively, all of the nodes 4 can be erased simultaneously by applying a voltage $V_5$ to the back gate.

Figure 19:
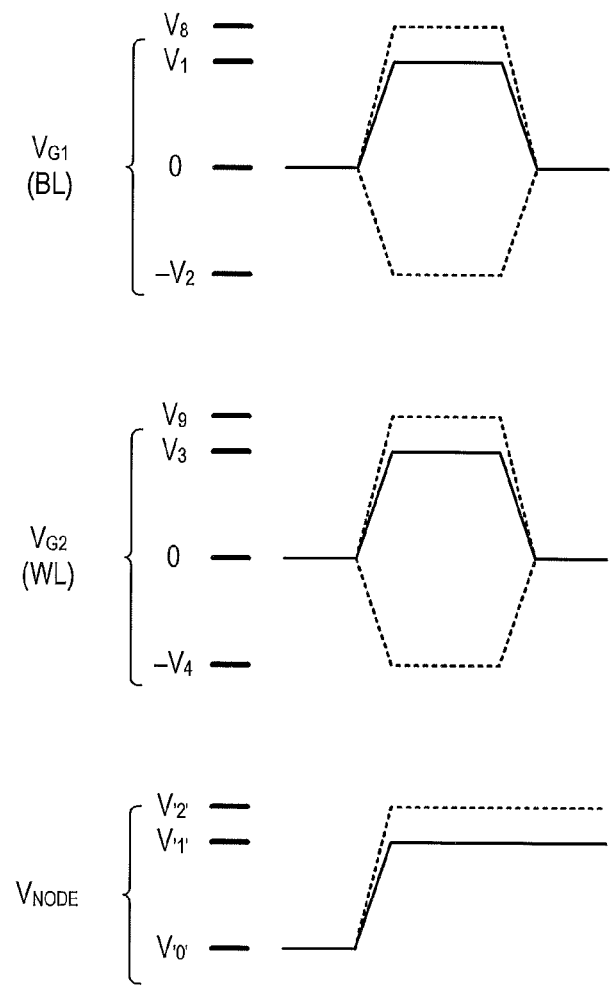
FIG. 19 shows timing diagrams for programming a trit.

Referring to FIG. 19, different gate biases (e.g. less negative gate biases) can be applied to allow two electrons to become bound to the ion 5 and, thus, form a D_ state. Thus, a node 4 can store 0, 1 or 2 electrons. The electrometer 9 can distinguish between the three different states.

The device 2 can be modified to store not only charge-based information, but also spin-based information. For example, if only D0 states are used, then three states can be defined, namely (i) no bound electron, (ii) one bound electron in a $|\uparrow\rangle$ state or (iii) one bound electron in a $|\downarrow\rangle$. If only D_ states are used (in particular if D0 states are not used), then five states can be defined, namely (i) no bound electrons, (ii) two bound electrons in a $|\uparrow\uparrow\rangle$ state, (iii) two bound electrons in a $|\downarrow\downarrow\rangle$ state, (iv) two bound electrons in a $|\uparrow\downarrow\rangle+|\uparrow\downarrow\rangle$ state or (v) two bound electrons in a $|\uparrow\downarrow\rangle-|\uparrow\downarrow\rangle$ state.

To store spin-based information, the electrometer 9 is modified so as to detect spin of bound electrons. This can be achieved, for example, by using a spin injection source or drain in the electrometer. The electrometer may be operated such that injection is blocked if an electron injected from a contact onto the island has the same spin as the electron bound to the ion 5.

The device 2 can operate as a quantum information processing device to store and process qubits.

In a first case, a qubit is defined using a single ion, i.e. located on a single node. The qubit is realised by using two possible states of a node, namely 0 or 1 electron.

Thus, the qubit is a charge qubit and electron spin is not considered. In a second case, a qubit is defined using two neighbouring ions and realised using two electrons. Depending on whether spin is considered, the qubit can be a spin qubit or a charge qubit.

In the first case, when a qubit is located on a single node, basis states can be defined as:
$|0\rangle \equiv$ |No bound electron⟩
$|1\rangle \equiv$ |One bound electron⟩

A process by which a qubit is prepared and manipulated will now be described:

Firstly, an initial state, for example $|\psi_i\rangle = |0\rangle$, is prepared. This comprises applying large negative biases to the gates 10, 11.

Secondly, a unitary transformation $U_t$ of the initial state is performed. This comprises applying pulses simultaneously to the gates 10, 11 for a predetermined time, t, having predetermined magnitudes such that transformation from the $|0\rangle$ state into the $|1\rangle$ state is not certain. For example, this may achieved by applying biases which ordinarily would cause an electron to become bound (i.e. which result in an effective bias $V_1$), but for a sufficiently short time, e.g. t~(h/E), where h is the reduced Plank constant and E is the energy of the state. Alternatively, biases can be applied for a longer period, wherein the effective bias lies between effective biases states for the $|0\rangle$ and $|1\rangle$ states, i.e. $V_0<V<V_1$. This transforms the initial state $|0\rangle$ into a final state $|\psi_i\rangle$ consisting of mixture of states $|0\rangle$ and $|1\rangle$.

Finally, a measurement of the final state $|\psi_i\rangle$ is carried out. This comprises using the electrometer 9.

The first and second steps are then repeated N-times, using the same predetermined time t. The measurements are used to obtain a statistical mixture of $|0\rangle^s$ and $|1\rangle^s$ and so determine the effect of the transformation $U_t$.

Reference is made to EP 1 262 911 A1, which is incorporated herein by reference, as to how a set of measurements and variation of the time, t, can be used to determine what period of time, t, is needed to effect a Hadamard Transformation, $U_H$.

As hereinbefore described, in the first case, the qubit is defined using a single ion.

In the second case, a qubit can be defined using two neighbouring ions, i.e. physically located on two neighbouring nodes. In this case, two different types of qubit can be formed, namely a spin qubit or a charge qubit (or qutrit).

In the second case, two electrons and two ions can form the following states:
Case A: |1 bound electron+1 bound electron⟩
Case B: |2 bound electrons+0 bound electrons⟩

In case A, an electron is bound to each ion and form singlet state (i.e. $|\uparrow\downarrow\rangle - |\uparrow\downarrow\rangle$) and triplet state (i.e. $|\uparrow\uparrow\rangle$, $|\uparrow\downarrow\rangle + |\uparrow\downarrow\rangle$ and $|\downarrow\downarrow\rangle$). Thus, this can be used to define a spin qubit having the following basis states:
$|0\rangle \equiv$ |singlet state⟩
$|1\rangle \equiv$ |triplet state⟩

Two arrangements can be used to manipulate spin states and, thus, carry out a singlet-triplet transition:

Firstly, ferromagnetic ions, such as manganese ions ($Mn^{2+}$) which is also a fast diffuser, can be used in combination with gates formed from ferromagnetic material, for example, cobalt or iron.

Secondly, non-ferromagnetic ions, such sodium ($Na^+$), can be used in conjunction with non-ferromagnetic gates that change the electric field at the interface. The ground state can be either a singlet or triplet state depending on electric field. For example, in the absence of a field or presence of a weak electric field, the singlet state may be lowest state. As field increases, the energy level of the singlet and triplet states cross. In this case, $V=V_1$ (where $V_1$ is the effective voltage arising from voltages applied to the gates to cause one electron to be bound to an ion) and a transformation from a singlet state to a triplet state can be carried out by applying $(V_1-V_A)<V<(V_1+V_A)$ to each node, where $V_A$ is the voltage required to produce a strong enough electric field to cause singlet state/triplet state crossing, but not so large so as to avoid the formation of D_ state. Preferably, $V_A$ is as small as possible and can be of the order of magnitude of 100 microvolts or 1 millivolt. The device is configured such that the electric field at the interface for $V=V_1$ is close to a critical electric field for singlet-triplet transition so that, for example, $(V_1-V_A)$ results in the singlet state being the ground state but $(V_1+V_A)$ results in the triplet state being a ground state. Further details regarding detection of singlet-triplet transition can be found in "Singlet-triplet transition in a single-electron transistor at zero magnetic field" by A. Kogan, G. Granger, M. A. Kastner, D. Goldhaber-Gordon, and H. Shtrikman, Physical Review B volume 67, page 113309 (2003).

In case B, two electrons are bound to two ions. The two ions can share the two electrons equally (i.e. a $|11\rangle$ state) or unequally (i.e. a $|02\rangle$ state or a $|20\rangle$ state). Thus, this can be used to define a charge qubit having the following basis states:

$|0\rangle = |11\rangle$
$|1\rangle = |02, 20\rangle$

The effective voltages to cause no electrons, one electron and two electrons to become bound to an ion are $V_0$, $V_1$ and $V_2$ respectively and $V_0 < V_1 < V_2$ for a p-type semiconductor.

Applying gate biases to the gates which result in an effective bias of $V_0 + V_B$ on one node can result in either 0 or 1 electrons being bound to the first ion, where $V_B$ is about $(V_1 - V_0)/2$, but can be found by routine experiment. Applying gate biases to the gates which result in an effective vias of $V_2 - V_C$ the second node can result in either 1 or 2 electrons being bound to the second ion, where $V_C$ is about $(V_2 - V_1)/2$, but can be found by routine experiment.

Thus, this can be used to transform a qubit from and initial state $|0\rangle$ into a mixture of $|0\rangle$ and $|1\rangle$ states.

The $|11\rangle$ state can hybridize into 4 states which are energetically closely spaced to each other to the $|02\rangle$. . Furthermore, the $|02\rangle$ can hybridize. Thus, hybridization can lead to additional states and, thus, can lead to a higher information storage density.

An array of entangled qubits can be formed since the nodes are sufficiently close to each other that they interact. Thus, the array lends itself to "one-way" or "measurement-based" quantum computing. Reference is made to "Measurement-based quantum computation with cluster states" by R. Raussendorf, D. E. Browne and H. J. Briegel, Physical Review A, volume 68, page 022312 (2003), which is incorporated by reference.

It will be appreciated that many modifications may be made to the embodiments hereinbefore described. For example, more than thermoelectric cooler may be provided so as to allow local cooling and so selectively cool parts of a chip. Also, resistive tracks may be provided to allow localised heating.

The invention claimed is:

1. An apparatus comprising:
   an insulating region;
   a semiconductor region adjacent to the insulating region;
   an array of impurity ions disposed in the insulating region at a predetermined distance from the semiconductor region;
   an array of electrometers arranged to detect whether at least one charge carrier in the semiconductor region is bound to a respective impurity ion;
   an array of sets of at least one control gate, each set associated with a respective electrometer, each at least one control gate-being configured to apply an electric field to the insulating region and semiconductor region for controlling binding of at least one charge carrier to a respective impurity ion;
   wherein each at least one control gate is configured to be operable to cause at least one charge carrier in the semiconductor region to bind to a respective impurity-ion in response to applied an bias and wherein the impurity ions are arranged in the insulating layer and are separated from the semiconductor region by the predetermined distance such that the at least one charge carrier and the impurity ion bind at the applied bias without the at least one charge carrier leaving the semiconductor region and remain bound when the applied bias is removed.

2. The apparatus according to claim 1, wherein the impurity ions are positively charged ions and the at least one charge carrier is at least one electron.

3. The apparatus according to claim 1, wherein the impurity ions are a single-valence electron ions.

4. The apparatus according to claim 3, wherein the impurity ions comprise hydrogen, sodium, lithium or potassium.

5. The apparatus according to claim 1, wherein the semiconductor region comprises silicon.

6. The apparatus according to claim 1, wherein the insulating region comprises a dielectric material.

7. The apparatus according to claim 6, wherein the dielectric material comprises silicon dioxide.

8. The apparatus according to claim 1, comprising a spacer region separating the insulating region and the semiconductor region.

9. The apparatus according to claim 1, wherein the insulating region and the semiconductor region comprises a layer of dielectric material adjoining a layer of semiconductor material.

10. The apparatus according to claim 1, wherein each electrometer comprises a source region, a drain region and a floating island configured such that a conduction path is formed between the source and drain regions via the floating island.

11. The apparatus according to claim 10, wherein the floating island is adjacent to the insulating region.

12. The apparatus according to claim 11, wherein the floating island adjoins the insulating region.

13. The apparatus according to claim 1, further comprising a cooler thermally coupled to at least the insulating region and configured to cool the insulating region below a transition temperature so as to cause the impurity ions to be frozen in position in the insulating region.

14. The apparatus according to claim 1, wherein the at least one control gate includes a first gate provided by a portion of a first conductive line and a second gate provided by a portion of a second conductive line which crosses the first conductive line.

15. The apparatus according to claim 1 which is a memory device.

16. The apparatus according to claim 1 which is a quantum information processing device.

17. The apparatus according to claim 1, wherein the predetermined distance is between 3-30 mm.

18. A method of fabricating an apparatus, comprising:
   providing a semiconductor region;
   providing an insulating region adjacent to the semiconductor region;
   providing an array of impurity ions disposed in the insulating region at a predetermined distance from the semiconductor region;
   providing an array of electrometers, each electrometer arranged to detect whether at least one charge carrier in the semiconductor region is bound to a respective impurity ion; and
   providing an array of sets of at least one control gate, each set associated with a respective electrometer, each at least one control gate being configured to apply an electric field to the insulating region and semiconductor region for controlling binding of at least one charge carrier to a respective impurity ion;
   wherein each at least one control gate is configured to be operable to cause at least one charge carrier in the semiconductor region to bind to a respective impurity ion in response to an applied bias and wherein the impurity ions are arranged in the insulating layer and are separated from the semiconductor region by the predetermined distance such that the at least one charge carrier and the impurity ion bind at the applied bias without the at least one charge carrier leaving the semiconductor region and remain bound when the applied bias is removed.

19. The method according to claim 18, wherein the predetermined distance is between 3-30 mm.

* * * * *

UNITED STATES PATENT AND TRADEMARK OFFICE
CERTIFICATE OF CORRECTION

PATENT NO. : 8,735,964 B2
APPLICATION NO. : 12/902483
DATED : May 27, 2014
INVENTOR(S) : Thierry Ferrus It is certified that error appears in the above-identified patent and that said Letters Patent is hereby corrected as shown below:

On the Title Page

Item (73): delete "Tokyo, PA (US)"

Insert: -- Tokyo, JP (JP) --

Signed and Sealed this
Fourteenth Day of October, 2014

Michelle K. Lee
*Deputy Director of the United States Patent and Trademark Office*